United States Patent
Fukushima et al.

[11] Patent Number: 6,045,893
[45] Date of Patent: Apr. 4, 2000

[54] MULTILAYERED ELECTRONIC PART WITH MINIMUM SILVER DIFFUSION

[75] Inventors: Hideko Fukushima, Saitama-ken; Naoyuki Satoh; Hiroyuki Itoh, both of Tottori-ken; Tomomi Ogawa, Saitama-ken, all of Japan

[73] Assignee: Hitachi Metals, Ltd., Tokyo, Japan

[21] Appl. No.: 09/075,822

[22] Filed: May 12, 1998

[30] Foreign Application Priority Data

Dec. 9, 1997 [JP] Japan ................................. 9-356086

[51] Int. Cl.⁷ ................................................ B32B 3/00
[52] U.S. Cl. ...................... 428/209; 428/210; 428/901; 174/255; 257/179
[58] Field of Search ..................... 428/209, 210, 428/901; 174/255, 256, 257; 257/179

[56] References Cited

U.S. PATENT DOCUMENTS

| | | | |
|---|---|---|---|
| 4,490,429 | 12/1984 | Tosaki et al. | 428/195 |
| 4,746,557 | 5/1988 | Sakamoto et al. | 428/138 |
| 5,164,882 | 11/1992 | Kanai et al. | 361/321 |
| 5,292,574 | 3/1994 | Kata et al. | 428/209 |
| 5,621,190 | 4/1997 | Yamasaki et al. | 174/52.4 |

FOREIGN PATENT DOCUMENTS 8-259263  10/1996  Japan .

Primary Examiner—Timothy M. Speer
Assistant Examiner—Bryant Young
Attorney, Agent, or Firm—Sughrue, Mion, Zinn, Macpeak & Seas, PLLC

[57] ABSTRACT

A multilayered electronic part with minimized silver diffusion into ceramic body. The multilayered electronic part is produced by sintering a green ceramic body of a plurality of ceramic layers comprising a main phase and a grain boundary phase, at least one of the ceramic layers being printed thereon Ag-containing internal electrode patterns which may serve as markers for indicating several information such as a production number, a name of manufacturer, a kind of circuit, etc. By the production method of the invention, the diffusion of Ag in the internal electrode patterns into the ceramic body is effectively prevented to avoid the deterioration of the electrical characteristics as well as to avoid the blackening of the ceramic to ensure a high lightness of the ceramic body which enhances the reliability of the visual identification and distinguishability of the markers.

14 Claims, 20 Drawing Sheets

| Addition Amount of Ag | In Air | In Nitrogen |
|---|---|---|
| 0 wt. % | | |
| 0.5 wt. % | | |
| 2 wt. % | | |
| 10 wt. % | | |

(×200)

CONDITIONS ; Radiation;Mg Kalpha, Max Counts Rats;3051cps,
Analyser;20eV, Step Size;0.10eV, Dwell Time;200ms, No Of Channels;231,
No Of Scan;15, Time for Region;693sec

OXIDATIVE ATMOSPHERE
(BLACKENING)

NON-OXIDATIVE ATMOSPHERE
(DISAPPEARANCE OF BLACKENED PORTION)

MULTILAYERED ELECTRONIC PART WITH MINIMUM SILVER DIFFUSION

BACKGROUND OF THE INVENTION

The present invention relates to a ceramic electronic part of integrally sintered structure for use in microwave circuits, etc.

Multilayered electronic parts are small-sized electronic parts widely used in a frequency range from low frequency to microwave, and produced by laminating a plurality of ceramic green sheets having thereon printed electrode patterns and integrally sintering the laminated green sheets. The multilayered electronic part includes a single-functional part such as a multilayered chip capacitor, a multilayered inductor and a multilayered transformer, and a multifunctional part such as a band pass filter (BPF), a low pass filter (LPF), a high pass filter (HPF), an antenna switch, a coupler, etc.

As the ceramic material, various dielectric materials and magnetic materials have been used depending on the required performance of the multilayered electronic part. Typical dielectric material may include barium titanate, calcium titanate, calcium zirconate, lead titanate, lead titanate zirconate, alumina, etc. The magnetic material is typically a soft ferrite such as NiZn ferrite, etc.

The material for the electrode pattern must retains a good conductivity even after the sintering process, and Ag and Ag-based alloys which are relatively difficult to be oxidized at a high temperature have been used. The sintering temperature of laminated ceramic sheets is usually at 1100° C. or lower in view of the melting point of Ag and Ag-based alloys. To ensure the low sintering temperature, a low-melting oxide constituting a grain boundary phase of the ceramic is used as a secondary component together with the ceramic material constituting a main phase as a primary component.

However, when a ceramic sheet containing the low-melting oxide and having thereon electrode patterns as the internal electrode made of Ag or Ag-based alloys is sintered in air, the ceramic sheet is blackened and the dielectric loss of the ceramic is unfavorably increased particularly in the microwave region. Due to these problems, a known electronic part having an internal electrode made of Ag or Ag-based alloy has been inferior in appearance and/or performance, and difficult to be commercialized without an additional specific treatment.

There has been another problem in the known electronic parts.

Usually, after sintering laminated ceramic green sheets, the sintered product is made into a final electronic part through several steps of baking thereon external electrodes, plating the external electrodes with Ni, solder, etc. and printing markers for identifying or distinguishing product number, etc. Error in the printed markers, even only one character or only one symbol, will cause a misuse of the parts to result in a failure in obtaining the intended performance of the electronic parts or result in a serious accident. For example, if a position marker for an input terminal is printed on the output terminal side, a mismounted part will fail to exhibit the intended function. In addition to indicating the kind, etc. of the final products, the markers printed during the production process serve as indicators for controlling the position of semi-fabricated products in the automatic production system. Further, the markers are used in controlling or checking the product quality, etc.

The markers have been provided at various stages of the production process at a time or several times according to the intended use, for example, at the final stage of production, before sintering the green sheets, etc. Before completing the production, the integrally sintered body is exposed to severe conditions. For example, it is dipped in a strongly acidic plating solution, receives various physical or mechanical forces, etc. Therefore, the markers provided to a semi-fabricated product are likely to be corroded, disappear, become unclear, etc. when exposed to severe conditions. This increases the cost of selecting and resorting the products, thereby increasing the production cost of the electronic parts. In particular, the markers provided before the plating process have been practically impossible to be used for identifying or distinguishing the final products. In addition, when the electrode printed on a dielectric ceramic is made of a material containing Ag, the blackening of the ceramic body makes the markers difficult to be visually distinguished.

Japanese Patent Laid-Open No. 8-259263 discloses a glass ceramic dielectric material having a high relative dielectric constant and a low dielectric loss at microwave region. It is taught that since the glass ceramic dielectric material can be sintered at a low temperature, silver and copper can be used as the material for electrodes and conductors. The glass ceramic dielectric material comprises 40–90 weight % of a glass powder and 60–10 weight % of a ceramic powder, the glass powder comprising 10–35 weight % of $SiO_2$, 5–35 weight % of $Ln_2O_3$ (oxides of lanthanoid), 15–50 weight % of $TiO_2$, 3–45 weight % of RO (oxides of alkaline earth metal), 1–30 weight % of $Bi_2O_3$ and 0–25 weight % of $ZrO_2$. The glass powder may be added with PbO up to 30%. The ceramic powder is at least one of $Al_2O_3$, $ZrO_2$, $ZrSiO_4$, $ZrTiO_4$, $TiO_2$, RO—$TiO_2$ ceramic such as $BaTi_4O_9$, $Ba_2Ti_9O_{20}$, $CaTiO_3$ and $SrTiO_3$, $Ln_2O_3$—$TiO_2$ ceramic such as $Nd_4Ti_9O_{24}$ and $La_4Ti_9O_{24}$, and RO—$Ln_2O_3$—$TiO_2$ ceramic such as $BaNd_2Ti_5O_{14}$ and $SrPr_2Ti_3O_{10}$.

However, the sintered body shows a relatively high dielectric loss, $12 \times 10^{-4}$ to $22 \times 10^{-4}$, and the ceramic body is blackened to have a low lightness.

OBJECT AND SUMMARY OF THE INVENTION

Accordingly, an object of the present invention is to provide multilayered electronic parts having silver internal electrodes, which show excellent electrical characteristics in microwave region.

Another object of the present invention is to provide multilayered electronic parts having silver internal electrodes, which have a ceramic surface with a high lightness.

Still another object of the present invention is to provide multilayered electronic parts having silver internal electrodes, which have reliable markers being correctly identified or distinguished with the eye and being provided with inexpensive cost.

As a result of the intense research in view of the above objects, the inventors have elucidated the phenomenon of blackening due to the diffusion of Ag into the ceramic body and have found that the problems involved in the conventional multilayered electronic parts mentioned above can be solved by preventing the diffusion of Ag into the ceramic body. Based on this finding, the present invention has been accomplished.

Thus, in a first aspect of the present invention, there is provided a multilayered electronic part with a minimized silver diffusion into a ceramic body, produced from a laminated body of a plurality of ceramic green sheets, at least one of said ceramic green sheets being printed thereon internal electrode patterns containing silver, and said ceramic body being an integral part made from said plurality of ceramic green sheets and containing a main phase and a grain boundary phase.

In a second aspect of the present invention, there is provided the multilayered electronic part with a minimized silver diffusion into a ceramic body as defined above, in which the surface of the ceramic body has a lightness of N6.5 or more or V6.5 or more in terms of Munsell color notation.

In a third aspect of the present invention there is provided a process of producing the multilayered electronic part with a minimized silver diffusion into a ceramic body as defined above, which comprises the steps of (a) forming a mixture of a material for constituting the main phase and a material for constituting the grain boundary phase into a plurality of green sheets; (b) printing the internal electrode pattern on at least one of the plurality of green sheets by using an electrically conductive material containing silver; (c) stacking at least one of the electrode pattern-printed green sheets and at least one green sheet having no electrode pattern thereon; (d) sintering the stacked green sheets at 800–1100° C.; and (e) fixing the external electrode to the internal electrode by baking at 600–1100° C., wherein at least a part of the sintering step and/or the baking step is conducted in a non-oxidative atmosphere.

BRIEF DESCRIPTION OF THE DRAWINGS

FIG. 9($b$) is a graph showing the results of TG-DTA analysis on a ceramic green sheet;

FIG. 12 shows photomicrographs by a stereomicroscope of each surface of the dielectric materials sintered in different atmospheres;

FIG. 21($b$) is a graph showing the results of TG-DTA analysis in nitrogen atmosphere on the powder mixture consisting of 95 weight % of $Bi_2O_3$ and 5 weight % of Ag;

DETAILED DESCRIPTION OF THE INVENTION

Figure 1:
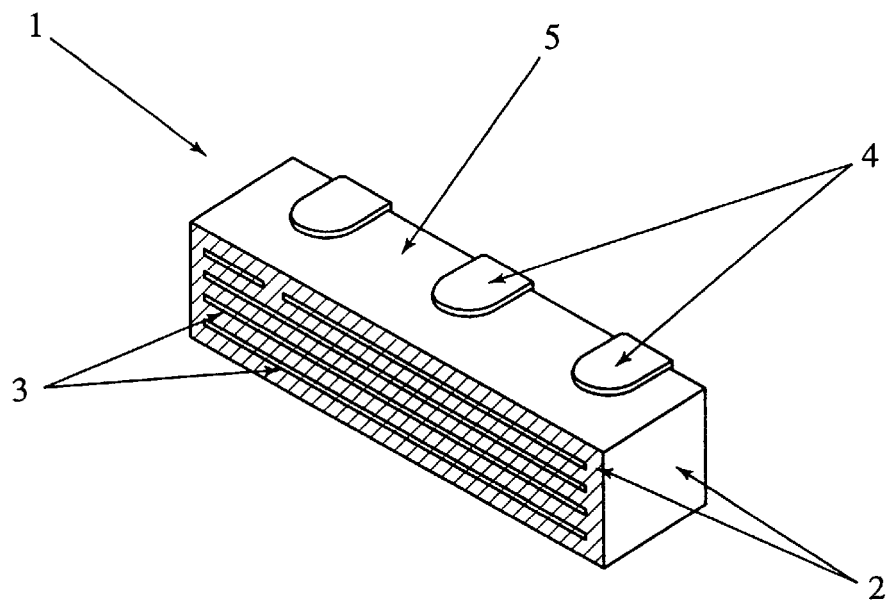
FIG. 1 is a perspective view partly in section showing an embodiment of the multilayered electronic part of the invention.

FIG. 1 is a perspective view partly in section showing an embodiment of the multilayered electronic part of the invention. As seen from FIG. 1, the multilayered electronic part 1 of the invention comprises an integral ceramic body portion 2 formed by sintering a laminate of a plurality of green ceramic sheets, at least one of the green ceramic sheets having thereon a printed internal electrode pattern 3, which constitutes a microwave circuit, etc., made of an electrically conductive material containing Ag. At least one external electrode 4 may be provided on the surface of the multilayered electronic part, for example, on an upper surface 5 thereof according to the intended use of the part.

The ceramic body is made of a high-resistance polycrystalline ceramic material, and comprises a main phase being a crystalline phase and a grain boundary phase. The ceramic material constituting the main phase is a dielectric material or a soft ferrite.

The dielectric material constituting the main phase of the ceramic body may be a microwave dielectric material for use in a frequency range of 30 MHz to 30 GHz having a low dielectric loss of about $7 \times 10^{-4}$ or less at 1 GHz. Specifically, the dielectric material may be selected from calcium zirconate ($CaZrO_3$), barium zirconate ($BaZrO_3$), strontium zirconate ($SrZrO_3$), lead zirconate ($PbZrO_3$), barium titanate ($BaTiO_3$), calcium titanate ($CaTiO_3$), lead titanate ($PbTiO_3$), lead titanate zirconate ($PbTiO_3$—$PbZrO_3$), alumina ($Al_2O_3$), $BaO$—$TiO_2$—$NdO_{2/3}$, $ZrO_2$—$TiO_2$—$SnO_2$, etc. An oxide having an intermediate composition, for example a compound oxide such as $Ba_{0.5}Ca_{0.5}ZrO_3$, may be also used. These material may be used alone or in combination of two or more. Of the above dielectric materials, calcium zirconate, barium zirconate, strontium zirconate and lead zirconate are preferable in view of producing an electronic part having a low dielectric loss and high performance in microwave region such as BPF with an excellent cut-off characteristic.

The soft ferrite constituting the main phase of the ceramic body may be selected from NiCuZn ferrite, CuZn ferrite, NiZn ferrite, NiCu ferrite, Cu ferrite and Ni ferrite. A part of the main component of the soft ferrite may be replaced by other elements and/or a secondary component may be contained in the soft ferrite as in the known soft ferrites. For example, Fe and Ni as the main components of the soft ferrite may be replaced by at least one of Al, Cr, Ti, Sn, Si, Sb, Li, Mg, Mn, Co, Nb, Mo, etc. and the soft ferrite may contain, as the secondary component, at least one of B, Ca, Ba, Sr, Y, Zr, In, Te, W, etc., each in an amount not deteriorating the effects intended by the invention.

The grain boundary phase is constituted by at least one element of Pb, Bi, Cu and V, which are present in the grain boundary phase in the form of oxide or compound oxide such as $PbO$, $Bi_2O_3$, $CuO$, $V_2O_5$, $PbO.Cu_2O$ (or $PbCu_2O_2$), $PbO.2Bi_2O_3$, $PbO.2Bi_2O_3.V_2O_5$, $Bi_2CuO_4$, etc. These oxide are all low-melting oxides having a melting point of 300 to 900° C. The oxide for constituting the grain boundary phase is used in an amount of 0.5 to 14 weight % in total based on the total amount of the materials constituting the main phase and the grain boundary phase. $PbO$ and/or $Bi_2O_3$ in an amount of 0.5 to 12 weight % is preferable because a ceramic green sheet can be sintered at 1100° C. or low and the dielectric loss in microwave region of the resultant sintered product is low.

The material for constituting the main phase and the material constituting the grain boundary phase may contain the same metal element. Particularly, when the main phase comprises Pb-containing dielectric material, namely, at least one of lead titanate, lead titanate zirconate and lead zirconate, a low-melting grain boundary phase of PbO is formed without separately adding Pb, Bi, Cu and V or oxides thereof. Since lead titanate and lead titanate zirconate are known as a useful piezoelectric ceramic, a multilayered electronic part, such as a piezoelectric inverter transducer and a piezoelectric filter, having good electro-mechanical transducing characteristics and a good appearance (high lightness without blackening) can be obtained by using lead titanate and lead titanate zirconate as the material for constituting the main phase.

Figure 2:
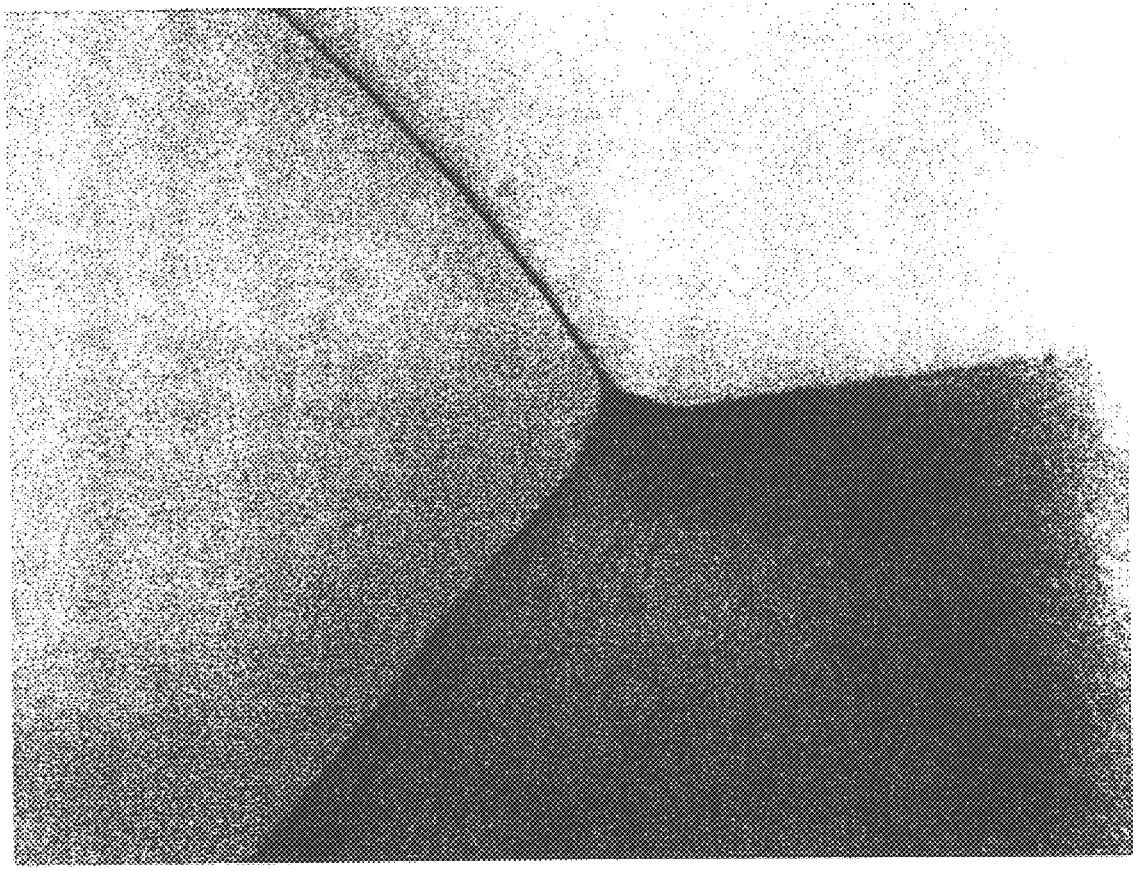
FIG. 2 is a photomicrograph by a transmission electron microscope showing the crystalline microstructure of a ceramic body of the invention.

FIG. 2 is a photomicrograph by a transmission electron microscope (TEM) showing the crystalline microstructure of a dielectric ceramic body 2 in FIG. 1. The portions appearing relatively bright are crystal grains. In the invention, the main phase refers to those crystal grain phase. The dark triangle at the central portion is a specific point known as the grain boundary triple point. From the triple point, the grain boundaries, as dark lines, extend in three directions. The grain boundary phase mentioned in the invention include such triple points and linear grain boundaries. In general, the grain boundary phase is present as the liquid phase during the sintering process. The thickness of the grain boundary phase other than the triple point is usually about 1 nm or less, and increases with increasing amount of the impurities and additives. As compared with the main phase, the grain boundary phase has a higher porosity, and is susceptible to corrosion by acids. The difference in these features leads a different transmittance of X-ray and a different solubility in a solvent, which permit separation of the grain boundary phase from the main phase to facilitate the chemical analysis of the grain boundary phase.

The internal electrode pattern is made of an electrically conductive material containing Ag, which may be Ag foil, Ag paste and Ag-based alloy such as Ag—Pd alloy and Ag—Pt alloy. The conductive material may contain elements other than Pd and Pt. For example, an Ag paste containing a glass frit (glass powder or granulate) which contains a glass-forming element such as B (boron) may be usable as the conductive material.

The multilayered electronic parts of the invention may be provided on the surface thereof external electrodes in addition to the internal electrodes. The external electrode pattern may be made of the same conductive material as mentioned above.

The most important feature of the invention is to minimize silver in the electrode pattern from diffusing into the ceramic body, thereby improving the electrical characteristics of the ceramic body and the resultant multilayered electronic parts. Further, when the ceramic body is made of the dielectric material, the ceramic body acquires a high lightness to ensure the highly reliable visual identification or distinguishability of the markers interiorly provided in the ceramic body or exteriorly provided on the surface of the ceramic body.

The amount of Ag which is present in the form of metal and/or oxide in a portion of the ceramic body 10 $\mu$m or more apart from the periphery of the internal electrode is preferably 0.5 weight % or less in terms of Ag element based on the total amount of the metal elements in the same portion. The amount of Ag in a given portion is increased with decreasing distance from the internal electrode, and vice versa. However, as a result of measurements, it has been found that the amount of Ag varies widely in a portion within 10 $\mu$m from the internal electrode, thereby making it difficult to unequivocally define the amount of Ag in such a portion. Therefore, in the invention, the measuring portion is restricted to the portion 10 $\mu$m or more apart from the periphery of the internal electrode.

The amount of Ag which is present in the form of metal and/or oxide in the grain boundary phase is preferably 5 weight % or less in terms of Ag element based on the total amount of the metal elements in the grain boundary phase. An amount exceeding 6 weight % causes the blackening of the surface of the ceramic body and deterioration of electrical characteristics such as insertion loss of the electronic part. The amount of Ag in the grain boundary phase is more preferably 1 weight % or less, because more excellent appearance (high lightness with minimum blackening) and/or electrical characteristics are obtained.

The appearance (high lightness with minimum blackening) of the ceramic body and the electrical characteristics of the multilayered electronic part can be improved by reducing the amount of Ag which is present in the form of metal and/or oxide in the main phase of the ceramic body. The amount is preferably 0.2 weight % or less, and more preferably 0.01 weight % or less in terms of Ag element based on the total amount elements in the main phase.

By minimizing silver in the electrode pattern from being diffused into the ceramic body as mentioned above, the dielectric loss of the ceramic body in microwave region can be reduced as low as $7 \times 10^{-4}$ or less, preferably $5 \times 10^{-4}$ or less at a frequency of 1 GHz. The electronic part of the invention having such a ceramic body shows excellent electrical characteristics. For example, when the multilayered electronic part of the invention is applied to a filter, a good cut-off characteristics, a reduced insertion loss and an increased electrical Q (ratio of effective signal to ineffective signal) can be obtained.

As mentioned above, the ceramic body of the invention has a high lightness by preventing silver in the electrode pattern from diffusing into the ceramic body when the ceramic material is the dielectric material. Namely, in the resent invention, the dielectric ceramic body having thereon printed electrode patterns containing Ag has nearly the same lightness as the dielectric ceramic body obtained without printing the electrode patterns.

The high lightness of the dielectric ceramic body referred to in the invention is expressed by Munsell color notation, and V6.5 or more, preferably V8.5 or more when the ceramic body is chromatic, or N6.5 or more, preferably N8.5 or more when the ceramic body is achromatic each without blackened portion. The dielectric ceramic body having a high lightness as defined above is opaque or semitransparent. When the dielectric ceramic body is chromatic, the hue and the saturation of the chromatic color are not strictly limited, and usually, the Munsell hue notation of the color is 5R (red) through 5YR (yellow-red) to 5Y (yellow) in Munsell hue circle and Munsell chroma corresponding to the saturation of the color is C9 or less, preferably C6 or less, and Munsell value corresponding to the lightness is V6.5 or more.

The multilayered electronic part of the invention comprising a dielectric ceramic body may have markers having a highly reliable visual identification and distinguishability and a high environmental resistance, which are formed by electrode patterns on the surface of the ceramic body or by internal electrode patterns visible through the surface of the ceramic body.

The information expressed by the markers may be constructed by an entire or partial portion of the electrode patterns, or by a non-electrode area surrounded by the electrode patterns each in the form of at least one of letters, figures and symbols. The information indicated by markers may include function of the external electrode, orientation of the part (including products under process and final product), kinds of the part, code number of the part, specification of the part, manufacturer, etc.

Since, the blackening of the electrode itself and the dielectric ceramic around the electrodes are minimized in the invention, the markers exhibit a high reliability in the visual identification and distinguishability. Further, since at least one ceramic layer is inserted between the internal electrodes and the surface of the laminate body during the production process, the internal electrodes in the resultant multilayered electronic parts are protected from being directly exposed to a plating solution, a corrosive gas and an oxidative gas such as surrounding air. Therefore, the internal electrodes and internal markers have an extremely high resistance to environment as well as the high reliability in the visual identification and distinguishability, this enhancing the reliability of the function of the markers to indicate various information.

The markers are formed during a process of printing electrode patterns on a ceramic green sheet with a conductive material in the production process of a multilayered electronic part. The markers may also exhibit their function during the production process after the electrode printing step up to the final stage of the production in addition to after reaching the final product. For example, the markers may be utilized for controlling the position of the products during the production process, this being effected particularly in automated production system to increase the productivity of the multilayered electronic parts and other products having markers coated with the ceramic.

The multilayered electronic part of the invention may be produced by the method described below.

A powder of the material for constituting the main phase, i.e. the dielectric ceramic or soft ferrite, and the powder of the material for constituting the grain boundary phase are mechanically mixed and pulverized in a ball mill together with a grinding medium such as zirconia balls and a grinding aid such as polyvinyl butyral (PVB), butyl phthalyl butyl glycolate (BPBG), ethanol and butanol to prepare a slurry. The dielectric material may be one prepared by a hydrothermal synthesis or one prepared by a solid phase method wherein $CaCO_3$ powder and $ZrO_2$ powder, for example, are blended in a ball mill, calcined and then pulverized in ball mill to obtain $CaZrO_3$ powder. Prior to the mixing with the grinding medium and the grinding aid, if desired, a mixture of the material for constituting the main phase and the material for constituting the grain boundary phase may be calcined and pulverized to obtain a powder mixture. Further, for example, a powder mixture of $CaZrO_3$ and $Bi_2O_3$ may be prepared by calcining a powder mixture of $ZrO_2$, $Bi_2O_3$, and CaO or $CaCO_3$ and pulverized the calcined product.

The slurry thus obtained is made into a green sheet by a doctor blade method or other known methods. Alternatively, the slurry may be dried, disintegrated, calcined and pulverized to a powder form before being made into a green sheet. The thickness of the green sheet is preferably 20 to 200 μm.

Figure 3:
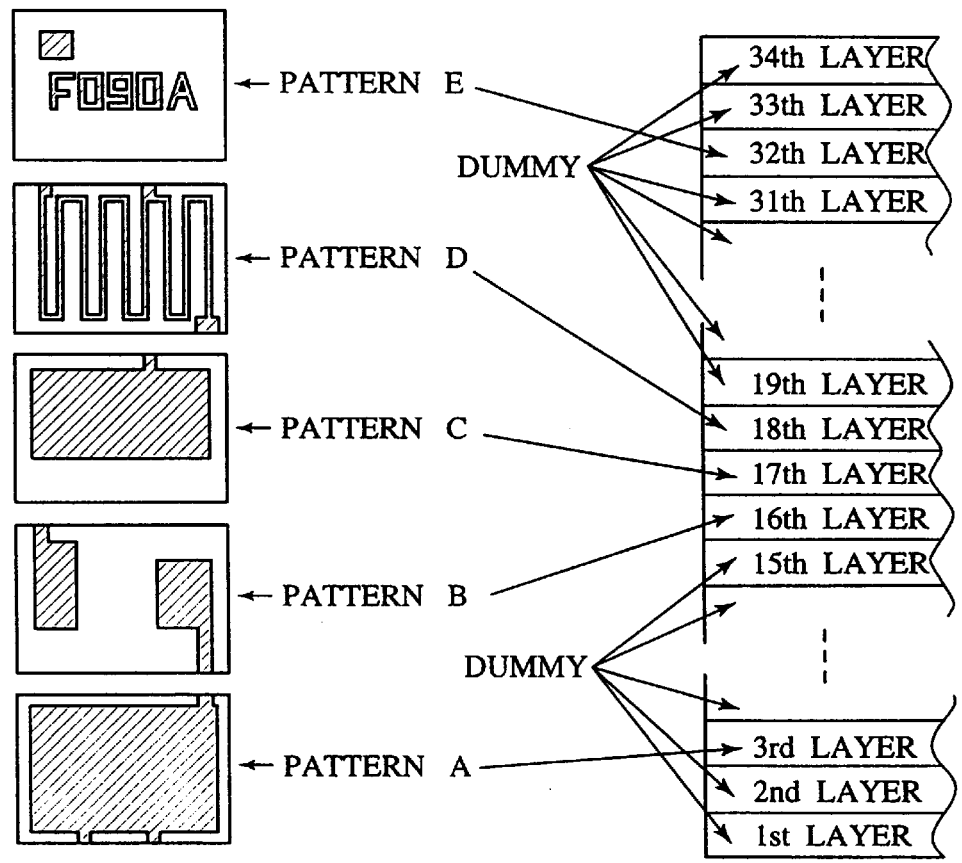
FIG. 3 is an illustration showing an example of internal electrode patterns usable in the multilayered electronic part of the invention and the lamination arrangement of ceramic layers.

On some of the green sheet, electrode patterns as shown in FIG. 3 are printed by a screen-printing method or other known printing methods using an electrically conductive material containing Ag in a thickness of 2 to 20 μm.

The procedures and conditions for each of the above steps are not critical in the present invention and other procedures and conditions known in the art may equally employed in producing the multilayered electronic parts of the invention.

The green sheets having printed with electrode patterns and the green sheets having no electrode pattern as the dummy layers are stacked. The number of the layers having electrode patterns, the number of the dummy layers and the tonal number of the laminated layers are not critical in the invention and depend on the intended use of the multilayered electronic parts. Generally, the total number of the laminated layers is about 5 to 100 in the electronic parts known in the art. The stacked layers are preferably subjected to a hot-press bonding at 80 to 150° C. under a pressure of 10 to 30 MPa.

The laminate body thus obtained is heated at a temperature rising rate of 0.2° C./sec to 3° C./sec then sintered at 800–1100° C. for 0.5 to 2 hours after dewaxing. When the sintering temperature is lower than 800° C., the sintering is insufficient and the resultant multilayered electronic parts are not suitable for practical use. When exceeding 1100° C., Ag in the internal conductive material melts out to make it difficult to obtain a sound product. After the sintering is completed, the sintered product is cooled to room temperature at a cooling rate of 0.5° C./sec to 5° C./sec. The sintered body thus cooled is then subjected to surface treatment to expose a part of the internal electrode, to which the external electrodes are fixed by heat treating preferably at a temperature of 600–1100° C., preferably not higher than the sintering temperature, and more preferably at about 900° C. or lower for 0.1 to 1 hour. The fixed external electrode is then plated by Ni and then soldered by a known method to obtain a final multilayered electronic part. During the above sintering process and heat treatment, a plurality of green ceramic sheets is formed into an integral ceramic body.

As will be described in detail below, the inventors have found that the diffusion of Ag is caused by the formation of liquid phase at about 700° C. by an eutectic reaction between the oxide of Ag and the material constituting the grain boundary phase. Therefore, at least a part of the production step carried out at 600° C. or higher, preferably at 700° C. or higher in the course of the production of the multilayered electronic parts of the invention is preferred to be conducted in the non-oxidative atmosphere to minimize the diffusion of Ag into the ceramic body. Therefore, in the production method of the invention, it is important that the sintering process and/or the heat treatment for baking the external electrodes, is conducted in a non-oxidative atmosphere. The non-oxidative atmosphere in the invention may be $N_2$ gas, Ar gas, $CO_2$ gas, $H_2$ gas and a gas mixture thereof, and not strictly limited to those as far as the atmosphere is non-oxidative. Further, the non-oxidative atmosphere may contain an oxidative gas such as air in a limited amount. Specifically, the sintering process and/or the heat treatment is conducted in a non-oxidative atmosphere under a pressure of 1.001 to 5.0 atm, preferably 1.01 to 2.0 atm for at least 5 minutes. The content of oxygen in the non-oxidative atmosphere is 15 volume % or less. Preferably, the sintering process and/or the heat treatment is conducted in a non-oxidative atmosphere containing 10 volume % or less of oxygen for at least 10 minutes, and more preferably in a non-oxidative atmosphere containing 8 volume % or less of oxygen for at least 20 minutes and up to 100 hours.

The multilayered electronic parts produced by the above method usually have a geometric dimension of 0.3 to 2 mm of height, 1 to 4 mm of width and 2 to 5 mm of length.

The present invention will be further described while referring to the following Examples which should be considered to illustrate various preferred embodiments of the present invention and it should be understood that the invention is not intended to be limited to the following specific embodiments.

EXAMPLE 1

A commercially available calcium zirconate ($CaZrO_3$) powder prepared by a hydrothermal synthesis and 10 weight %, based on $CaZrO_3$, of a commercially available $Bi_2O_3$ powder (guaranteed grade) were introduced into a ball mill pot. To the ball mill pot, were further added zirconia balls of 5 mm diameter as a grinding medium together with PVB (polyvinyl butyral), BPBG (butyl phthalyl butyl glycolate), ethanol and butanol, each as the liquid grinding aid. The ball milling was continued for 24 hours to obtain a slurry, which was then made into the form of sheet by a doctor blade method to obtain several green sheets each having a thickness of about 70 $\mu$m.

On some green sheets, internal electrode patterns as shown in FIG. 3 by hatched figures were screen-printed with a commercially available Ag paste containing ethyl cellulose, butyl carbitol, terpineol, etc. The thickness of the printed electrode was about 10 $\mu$m. The printed green sheets and other green sheets (dummy layers) with no printed electrode thereon were stacked as shown in FIG. 3 and subjected to hot-press bonding at 120° C. under a pressure of 20 MPa to obtain laminated body of 34 layers. The laminated body was cut by a dicer to obtain a chip having a width/length of 5.5 mm/4 mm and a stacked height of about 2 mm.

The chip was dewaxed at 600° C. After the completion of the dewaxing, a part of air was replaced by nitrogen gas and the temperature was raised to sinter the chip at 920° C. for one hour. During the temperature rise from 600° C. and the subsequent sintering process, the pressure of the non-oxidative atmosphere containing 7 to 8 volume % of oxygen was maintained at about 1.05 atm. Then, the sintered chip was allowed to cool to room temperature.

The cooled chip was subjected to a heat treatment, which corresponded to baking external electrodes, at 800° C. for one hour in nitrogen atmosphere containing a small amount of oxygen to produce Sample No. 1. During the heat treatment, the pressure of the non-oxidative atmosphere containing 7 to 8 volume % of oxygen was maintained at about 1.05 atm.

In the same manner as above except that the temperature rise, sintering and cooling were carried out in air in place of nitrogen atmosphere containing a small amount of oxygen, Sample No. 2 was produced. Further, in the same manner as in the production of Sample No. 1 except that the heat treatment was carried out in air in place of nitrogen atmosphere containing a small amount of oxygen, Sample No. 3 was produced. Comparative Sample No. 4 was produced in the same manner as in the production of Sample No. 1 except that all the production steps were conducted in air.

Figure 4:
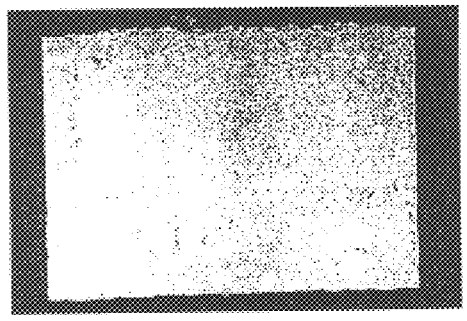
FIG. 4 is a photomicrograph showing the bottom surface of Sample No. 1 of Example 1.
Figure 5:
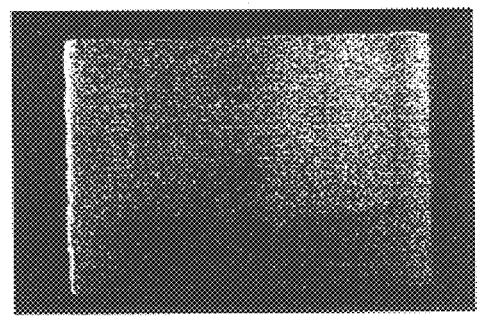
FIG. 5 is a photomicrograph showing the bottom surface of Sample No. 2 of Example 1.
Figure 6:
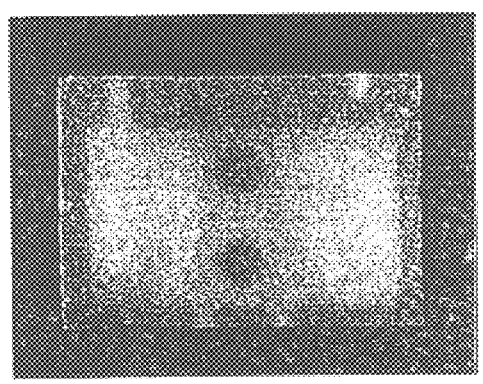
FIG. 6 is a photomicrograph showing the bottom surface of Sample No. 3 of Example 1.

The Sample No. 1 had a pale yellow (5Y 8.5/5) ceramic surface, and undesirable spots, smudge and discoloration (blackening) were not observed in any portion of the ceramic body. The ceramic body was semitransparent and the internal electrode patterns corresponding to the patterns A and E in FIG. 3 were confirmed visually through the uppermost surface and the bottom surface of the ceramic body (1st layer and 34th layer in FIG. 3) as shown in FIG. 4. The Sample No. 2 had a very pale yellow (5Y 8.5/2) ceramic surface, and the internal electrode patterns could be confirmed visually through the uppermost surface and bottom surface of the ceramic body because the ceramic body was semitransparent. The bottom ceramic surface of Sample No. 2 is shown in FIG. 5. As shown in FIG. 6, Sample No. 3 was slightly blackish in its whole periphery. Further, as seen from FIG. 7, the ceramic body of Comparative Sample No. 4 changed to black over its entire surface, namely, the surface was covered with black spots and black smudges. As seen from FIG. 8, which is a photomicrograph showing a cross section of Comparative Sample No. 4, only the ceramic near the internal electrode was whitish, whereas the other portion of the ceramic changed to pale black and had black spots. It can be seen from FIG. 8 that the degree of blackening and the number of spots increase towards the surface.

The dielectric loss, tan $\delta_\varepsilon$, at 1 GHz was measured on Sample Nos. 1–3 and Comparative Sample No. 4. The results are shown below.

Sample No. 1: tan $\delta_\in \leq 3.0 \times 10^{-4}$

Sample No. 2: tan $\delta_\in = 3.5 \times 10^{-4}$

Sample No. 3: tan $\delta_\in = 3.8 \times 10^{-4}$

Comparative Sample No. 4: tan $\delta_\in = 9.4 \times 10^{-4}$

Since the dielectric loss is preferred to be as small as possible, it has been confirmed that Sample Nos. 1–3 of the invention have good electrical characteristics.

The procedures of producing Sample Nos. 1–3 and Comparative Sample No. 4 were repeated except for omitting the internal electrode forming process to produce respective Test Piece Nos. 1a, 2a, 3a and 4a. The dielectric loss, tan $\delta_\in$ at 1 GHz was tan $\delta_\in \leq 3.0 \times 10^{-4}$ for any of Test Piece Nos. 1a, 2a, 3a and 4a. Also, the slight color change observed in Sample No. 3 and the remarkable defect observed in Sample No. 4 were not observed in any of the four test pieces. These results suggest that the blackening in the ceramic body may be responsible for the presence of Ag.

Figure 9A:
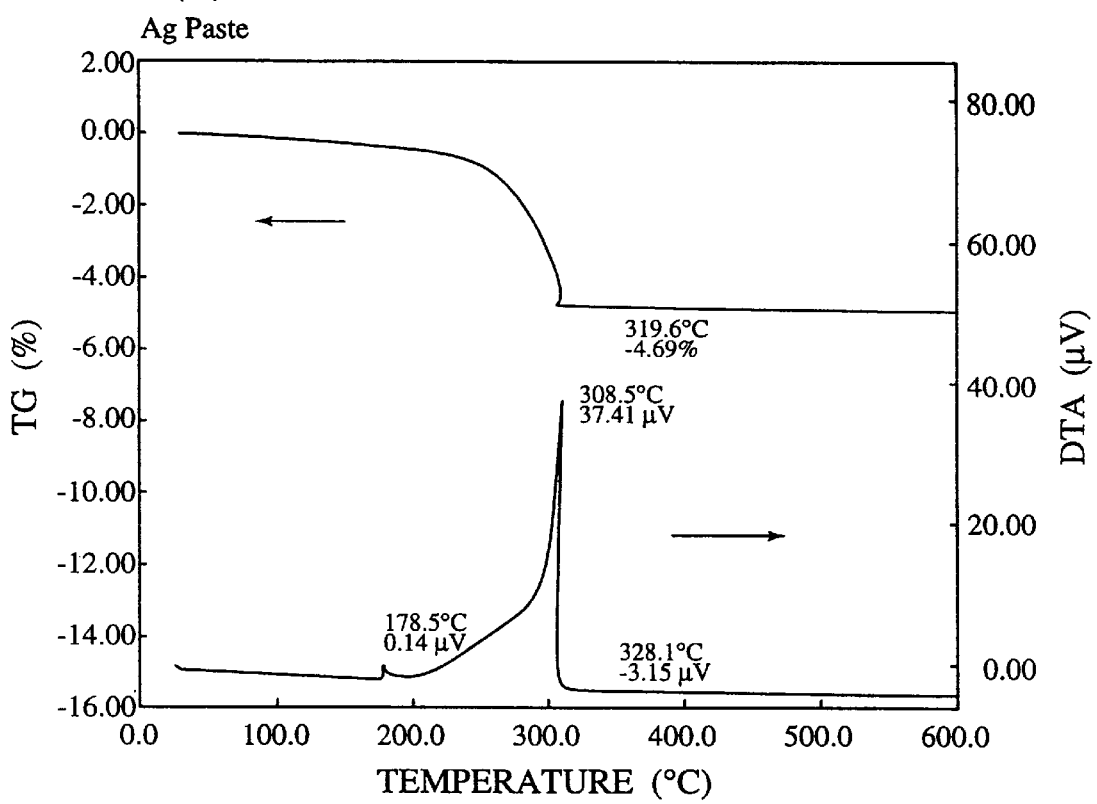
FIG. 9($a$) is a graph showing the results of a thermogravimetry-differential thermal analysis (TG-DTA) on an Ag paste.
Figure 9B:
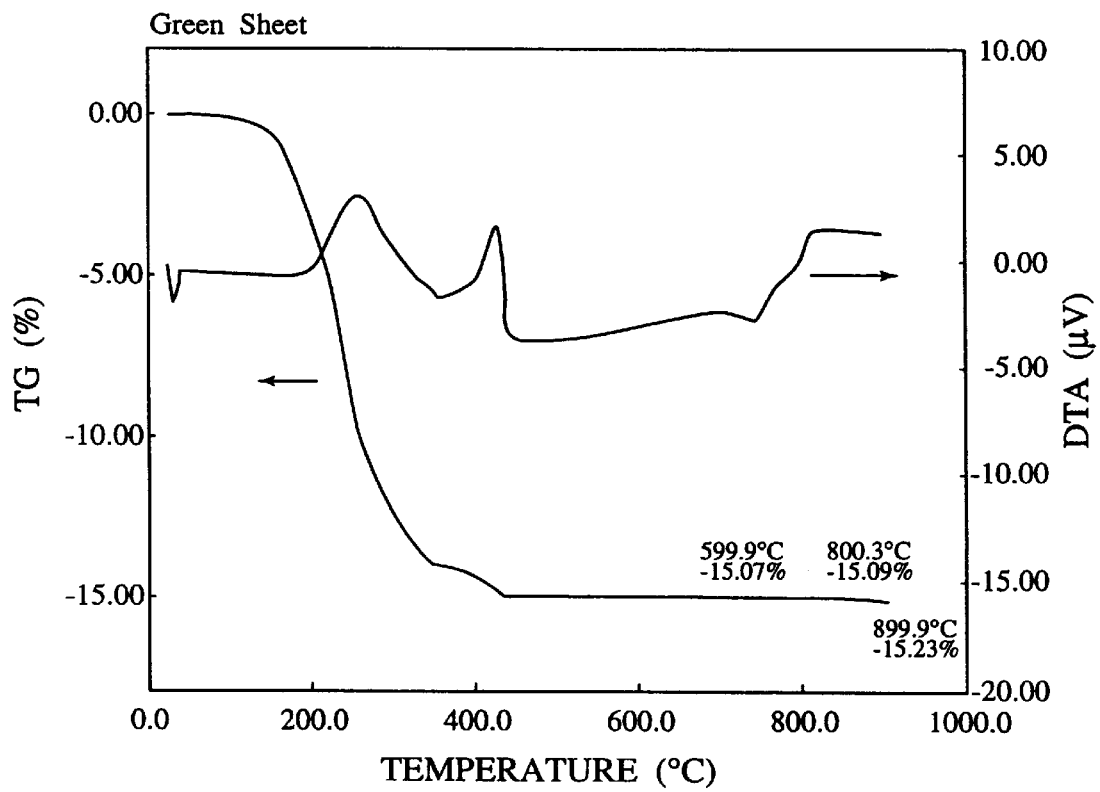

The Ag paste used above contained organic substances such as ethyl cellulose, butyl carbitol, terpineol, etc. Also, the green sheet contained organic substances such as PVB, BPBG, etc. From the results, shown in FIG. 9, of thermogravimetry-differential thermal analysis (TG-DTA) on a laminate body before sintering, it was confirmed that the organic substances in the Ag paste were nearly completely combusted before reaching 250° C., and the organic substances in the green sheet was combusted away before reaching 500° C.

From the results on Test Piece Nos. 1a, 2a, 3a and 4a and TG-DTA analysis, it would appear that the difference in the characteristics and appearance (presence of blackened portion in ceramic body) between Sample Nos. 1–3 and Comparative Sample No. 4 is not attributable to the residual carbon, but to the presence of Ag and the atmosphere during the sintering and baking (heat treatment) steps.

EXAMPLE 2

The dependency of the characteristics of multilayered electronic parts on the presence of Ag and the atmosphere during the sintering and baking (heat treatment) steps, and the mechanism of Ag diffusion from the electrode into the ceramic body were examined.

Experiment 1: Influence of Ag on Ceramic Properties When Sintered in Air

A powder mixture of $CaZrO_3$ and 5 or 10 weight %, based on $CaZrO_3$, of a sintering aid ($PbO.2Bi_2O_3$) was calcined at 850° C. for one hour and pulverized. After adding a predetermined amount of Ag powder (0.0%, 0.5%, 2.0% and 10.0% each being weight % based on the total amount of $CaZrO_3$ and $PbO.2Bi_2O_3$) and polyvinyl alcohol (PVA), the pulverized powder was granulated and molded to a green body by a molding die. The green body was sintered in air at 850° C., 900° C., 950° C. or 1000° C. for 2 hours.

Figure 10:
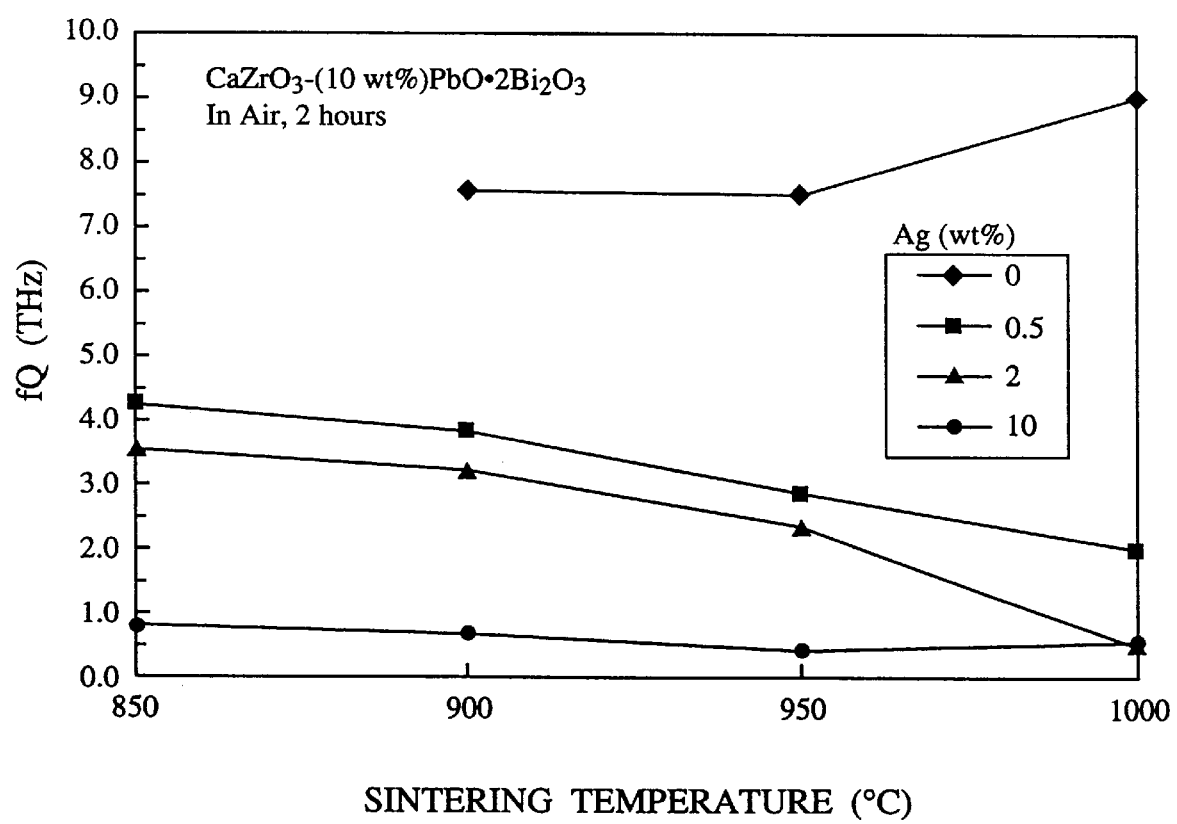
FIG. 10 is a graph showing the relationship between the addition amount of Ag and fQ.

The dielectric constant ($\in$) and the dielectric loss factor of the sintered product were measured by a dielectric resonator method (TE011 mode) of Hakki & Colman, and Q, the reciprocal of the dielectric loss factor, was calculated from the results. In FIG. 10, the relationship between the addition amount of Ag and fQ, which is the product of Q and the measuring frequency f, is shown. As seen from FIG. 10, fQ decreased with increasing addition amount of Ag. For example, fQ was 7.6 THz (1 THz=$10^{12}$ Hz) when Ag was not added, and when Ag was added in an amount of 0.5 weight %, fQ was 3.8 THz, namely, about half the value in case of no addition. The results show that BPF, for example, produced by the sintering in air has not only a poor appearance due to color change (blackening) but also a large insertion loss due to the diffusion of Ag into the ceramic body, thereby failing to obtain the intended characteristics. Therefore, the diffusion of Ag into the ceramic body should be prevented as much as possible. This is the important object of the invention.

Figure 11:
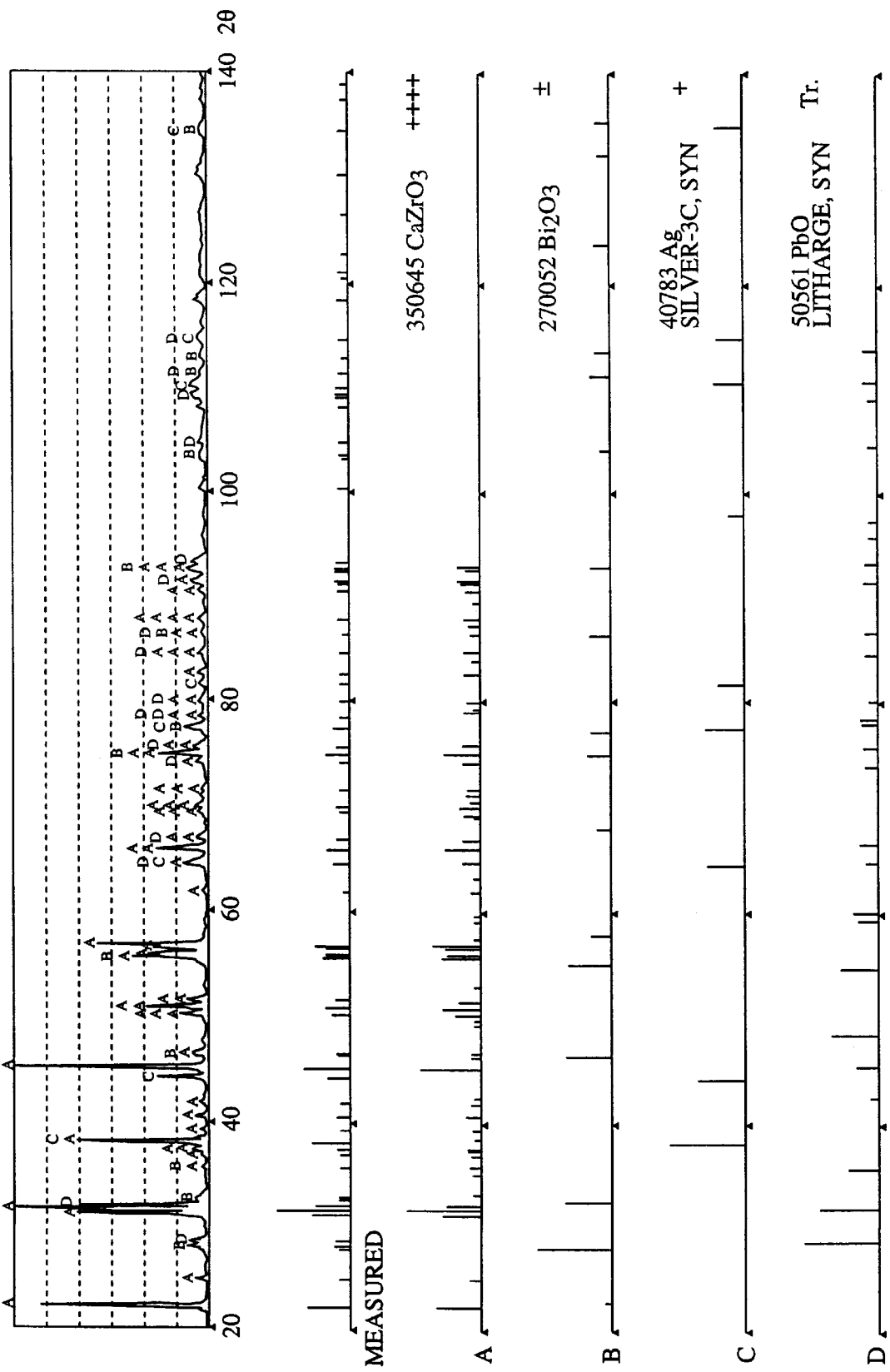
FIG. 11 is an X-ray diffraction (XRD) pattern of a sintered body added with 10 weight % of Ag.

In FIG. 11, an X-ray diffraction (XRD) pattern of the sintered product added with 10 weight % of Ag is shown. The sintered product added with Ag was qualitatively analyzed by visually evaluating the XRD patterns. The results are shown in Table 1.

TABLE 1

| Addition Amount of Ag | Sintered Product | | | |
|---|---|---|---|---|
| (weight %) | $CaZrO_3$ | $Bi_2O_3$ | PbO | Ag |
| 0.0 | ++++ | + | Tr. | — |
| 0.5 | ++++ | + | Tr. | — |
| 2.0 | ++++ | + | Tr. | Tr. |
| 10.0 | ++++ | + | Tr. | + |

Note:
++++: large amount;
+: small amount;
Tr.: trace amount;
—: not detected.

The main phase consisted of $CaZrO_3$, and PbO and $Bi_2O_3$ added as the sintering aid was present separately in the grain boundary phase. No reaction product of $CaZrO_3$ and the additive was detected.

Experiment 2: Existing Form of Ag in Dielectric Material Sintered in Air or Nitrogen Atmosphere The green bodies used in Experiment 1 were sintered at 900° C. for 2 hours in air or in nitrogen atmosphere. The sintered bodies thus obtained were observed on their surfaces by a stereomicroscope (magnification:×4). The results are shown in FIG. 12. As seen from FIG. 12, the colors of sintered ceramic bodies differed according to the atmosphere. When the addition amount of Ag was 0.5 weight %, black spots were found and the entire surface was greenish in case of sintering in air. When the sintering was carried out in nitrogen atmosphere, the surface showed pale yellow color (5Y 8.5/5), namely, the same color as in the dielectric material added with no Ag was obtained. The blackening was more significant in the sintering in air than in nitrogen atmosphere also in the case of the Ag addition amounts of 2 weight % and 10 weight %.

Figure 13:
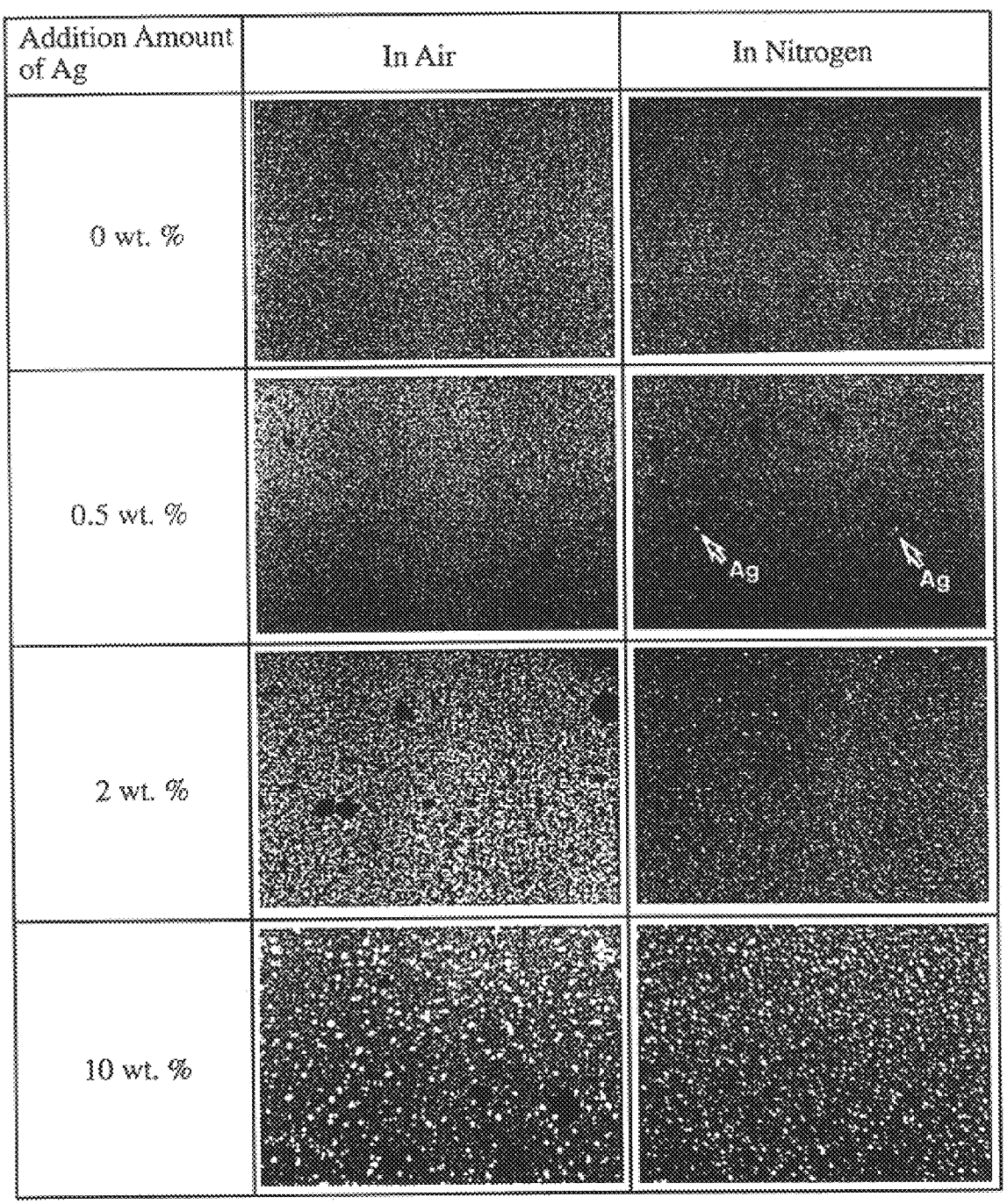
FIG. 13 shows photomicrographs by a metallographical microscope of each mirror-polished surface of the dielectric materials sintered in different atmospheres.

After mirror-polishing the surface of each sintered body, the microstructure of the mirror polished surface was observed under a metallographical microscope. The results are shown in FIG. 13. In case of sintering in air, Ag in the form of metal was found only when the addition amount of Ag was 10 weight %. In case of sintering in nitrogen atmosphere, Ag in the form of metal was found even in a small addition amount of 0.5 weight %. Further, the comparison of the results when the addition amount was 10 weight % showed that the amount of Ag in the form of metal was larger in case of the sintering in nitrogen atmosphere. Thus, it has been also confirmed from the metallographical microscope observation that a part of Ag changes to a form other than the metal form when sintered in air, whereas Ag is present in the form of metal when sintered in nitrogen atmosphere. Further, the results obtained in the sintering in nitrogen atmosphere show that the dielectric material added with Ag in an amount of 0.5 weight % based on the material constituting the main phase ($CaZrO_3$) is not blackened as far as Ag is present in the form of metal.

Figure 14:
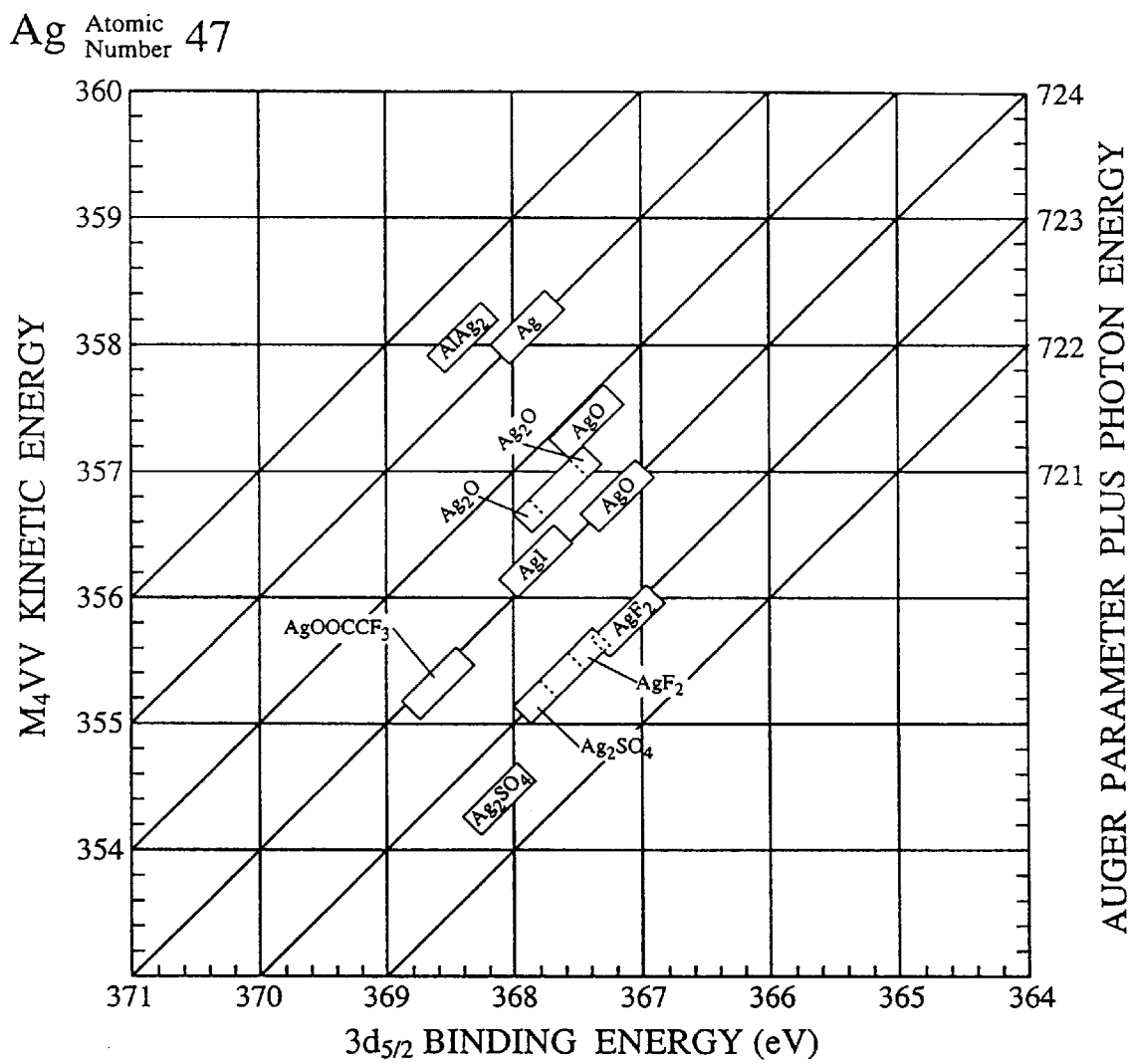
FIG. 14 is a graph showing the standard binding energy of Ag 3 $d_{5/2}$.
Figure 15:
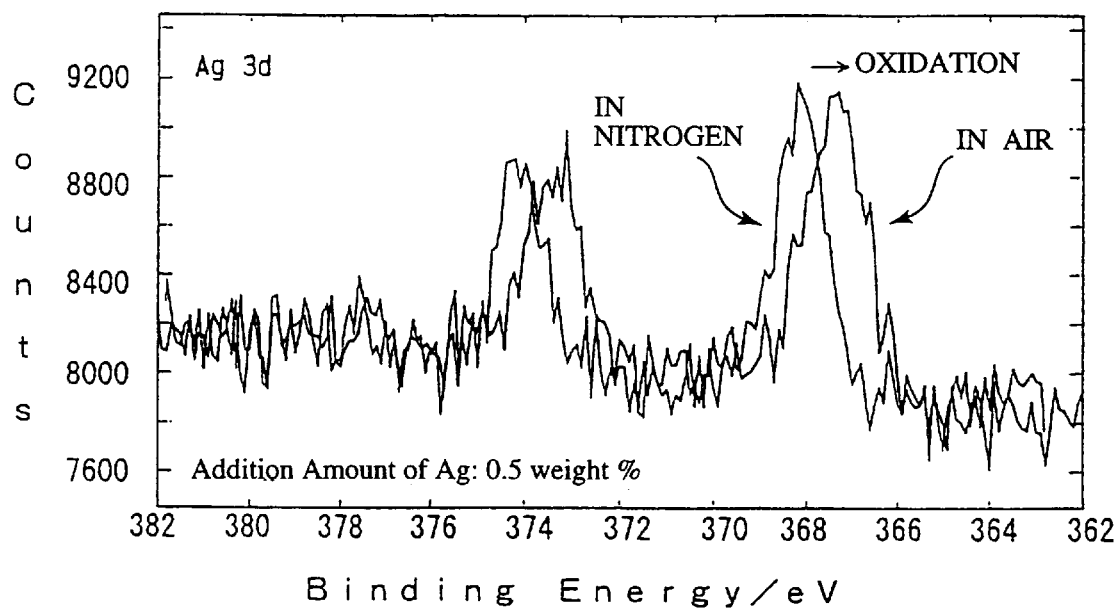
FIG. 15 shows narrow scan spectra of X-ray photo-electron spectroscopy (XPS) on the ceramic bodies added with 0.5 weight % of Ag sintered in air and in nitrogen atmosphere.

Then, the electron energy state of Ag existing in the sintered body was analyzed by X-ray photo-electron spectroscopy (XPS). The standard binding energy of Ag $3d_{5/2}$ is shown in FIG. 14, which shows that the binding energy decreases with increasing oxidation state. FIG. 15 shows narrow scan spectra of XPS in case of the Ag addition amount of 0.5 weight %. The binding energy when sintered in air was shifted to the low energy side as compared with the binding energy when sintered in nitrogen. This result shows that Ag exists in the form of metal when sintered in nitrogen, and a part of Ag exists in the form of oxide when sintered in air. In view of the measured binding energy, the oxide is supposed to be AgO. From the foregoing, it has been confirmed that the disadvantages of blackening and diffusion of Ag involved in the conventional ceramic laminate is responsible for Ag oxide.

In Table 2, the measured binding energy of Ag $3d_{5/2}$ when sintered in air and nitrogen atmosphere at various addition amounts of Ag are shown together with the standard binding energies of Ag, $Ag_2O$ and AgO.

TABLE 2

| Ag (weight %) | Binding Energy (eV) | |
|---|---|---|
| | Sintered In Air | Sintered In Nitrogen |
| 0.5 | 367.4 | 368.2 |
| 2.0 | 367.7 | 368.2 |
| 10.0 | 367.9 | 368.2 |

| Standard Binding Energy (eV) | |
|---|---|
| Ag | 368.2 |
| $Ag_2O$ | 367.8 |
| AgO | 367.4 |

As seen from Table 2, when sintered in air, the binding energy increased with increasing addition amount of Ag. This shows that the existing ratio of Ag metal to Ag oxide increases with increasing addition amount of Ag. However, the absolute amount of Ag oxide also increased with increasing addition amount of Ag. On the other hand, when sintered in nitrogen, the binding energy was constant irrespective of the change in the Ag addition amount. Thus, the results show that a part of Ag added in the form of metal changes to the form of oxide when sintered in air, whereas Ag remains in the form of metal regardless of the addition amount when sintered in nitrogen.

Experiment 3: Diffusion of Ag into Dielectric Material

In a ball mill pot, $CaZrO_3$ powder, 10 weight %, based on $CaZrO_3$, of $Bi_2O_3$ powder, zirconia balls with a diameter of 5 mm and distilled water were mixed for 24 hours to obtain a slurry. The slurry was dried, disintegrated and calcined at 800° C. for 2 hours. The calcined product was allowed to cool, disintegrated and pulverized in a ball mill pot together with zirconia balls with a diameter of 5 mm and distilled water for 24 hours. The pulverized product was then dried and disintegrated. The powder thus obtained was added with polyvinyl alcohol (PVA) and distilled water, granulated and classified to obtain granules having a grain size of about 100 μm. Then, an amount of the granule was charged into a molding die, dry-compression molded under 100 MPa and dried to prepare ten green bodies each having a size of 8.3 mm width×9.5 mm length×about 5 mm thickness were obtained. On one end surface in the length direction of each green body, a commercially available Ag paste was applied and dried. Five of the green bodies thus treated were sintered with the applied surface upside at 900° C. for one hour in air. The other five green bodies were heated in air up to 500° C. and then heated and sintered at 900° C. for one hour each in nitrogen atmosphere.

Each of the sintered bodies was then ground on one surface to have respective thickness of 1.5, 2.0, 2.5, 3.0 and 3.5 mm. Thereafter, the ground surface was mirror-polished. During the above treatments, the applied Ag paste was removed. The mirror-polished surface of each specimen was linearly analyzed by an electron probe micro analyzer (EPMA). There was no detectable difference between the five bodies all sintered in air, and between the five bodies all sintered in nitrogen atmosphere. Therefore, the following description will be based on only the results on the sintered bodies (Sample No. 6 sintered in air and Sample No. 7 sintered in nitrogen atmosphere) having a thickness of 3.0 mm.

Figure 16:
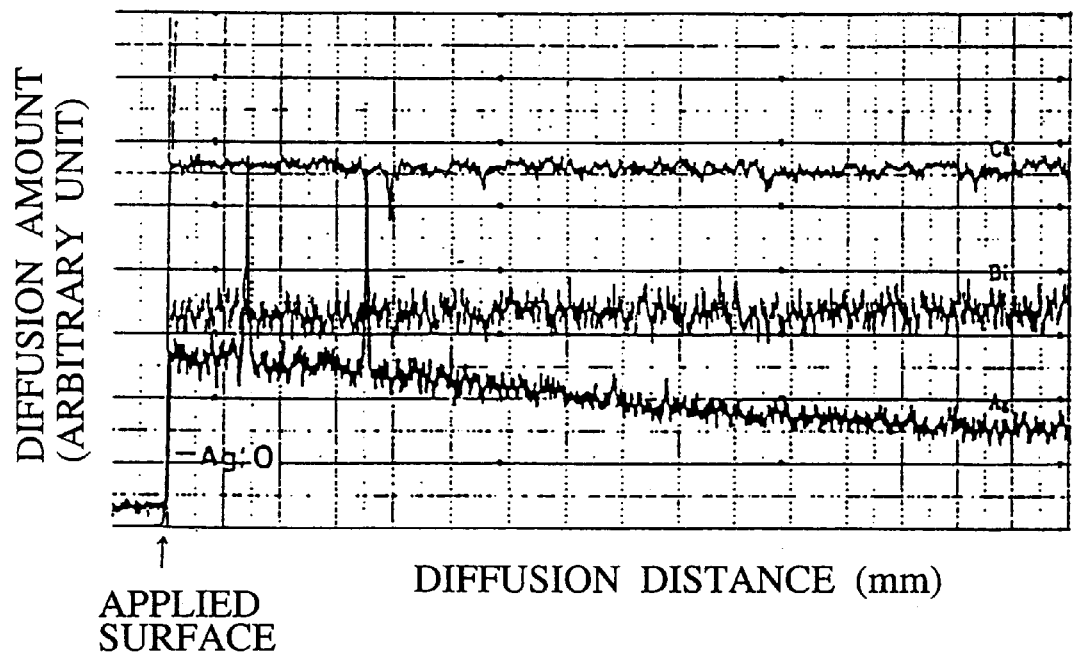
FIG. 16 is a graph showing the results of an electron probe micro analysis (EPMA) on Ag, etc. in the body sintered in air.
Figure 17:
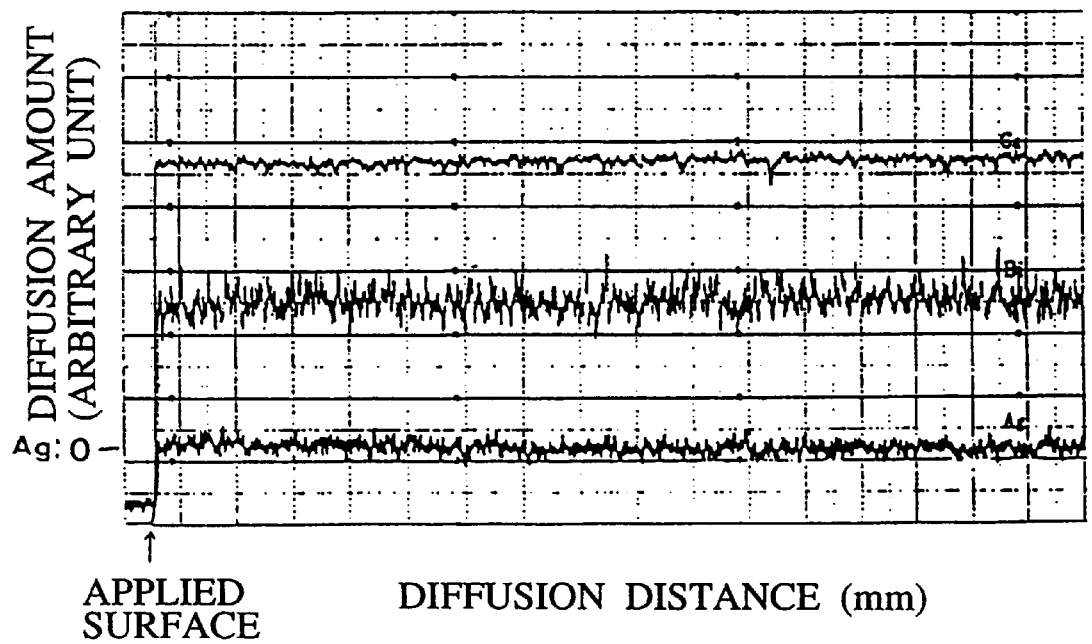
FIG. 17 is a graph showing the results of EPMA analysis on Ag, etc. in the body sintered in nitrogen atmosphere.

FIG. 16 is a chart of EPMA analysis of Sample 6 sintered in air. The abscissa indicates the distance (diffusion distance) from the Ag-applied surface. The scale is graduated in 100 μm and the subscale in 10 μm, and the right end shows that the distance from the Ag-applied surface is about 1.6 mm. The ordinate indicates the amount of Ca, Bi and Ag in arbitrary unit. "Ag: 0" shows that the amount of Ag is zero. Regarding Ca and Bi, the point showing zero amount is not shown. FIG. 17 is a chart of EPMA analysis of Sample No. 7 sintered in nitrogen gas, and is shown in the same manner as in FIG. 16. In FIGS. 16 and 17, the detected amount is shown in the same scale as far as the same element is concerned. The analysis accuracy for Ag was about ±0.01 weight %. Upon comparing FIG. 16 with FIG. 17, it would appear that a significant diffusion of Ag into the dielectric material occurred in Sample No. 6 which was sintered in air, while practically no Ag diffusion was found in Sample No. 7 sintered in nitrogen atmosphere.

In Sample No. 6, the diffusion amount was large in the portion near the Ag-applied surface and decreased with increased distance therefrom. Further, the diffusion of Ag was detectable even at 1.6 mm from the Ag-applied surface. With respect to Ca and Bi, the detected amount was constant throughout the analyzed portion for each of Sample Nos. 6 and 7.

In the same manner as in the preparation of Sample Nos. 6 and 7 except for adding no $Bi_2O_3$, Sample No. 8 (sintered in air) and Sample No. 9 (sintered in nitrogen atmosphere) were prepared. As a result of EPMA analysis, it was found that the diffusion of Ag into the dielectric material was not observed in both Sample Nos. 8 and 9.

In the same manner as in the preparation of Sample Nos. 6 and 7 except for changing 10 weight % of $Bi_2O_3$ to 10 weight % of $PbO.2Bi_2O_3$, Sample No. 10 (sintered in air) and Sample No. 11 (sintered in nitrogen atmosphere) were prepared. As a result of EPMA analysis, Sample No. 10 showed the diffusion of Ag into the dielectric material as in Sample No. 6, while Sample No. 11 showed practically no Ag diffusion as in the case of Sample No. 7.

In the same manner as in the preparation of Sample Nos. 6 and 7 except for changing the addition amount of $Bi_2O_3$ from 10 weight % to 5 weight %, Sample No. 12 (sintered in air) and Sample No. 13 (sintered in nitrogen atmosphere) were prepared. As a result of EPMA analysis, Sample No. 12 showed the diffusion of Ag into the dielectric material as in Sample No. 6, while Sample No. 13 showed practically no Ag diffusion as in the case of Sample No. 7.

From the above results, it has been confirmed that Ag does not diffuse into the ceramic in the absence of PbO and $Bi_2O_3$ irrespective of the sintering atmosphere. When the sintering was conducted in air, a significant amount of Ag diffused into the ceramic in the presence of PbO and $Bi_2O_3$. The diffusion amount of Ag increased with increasing amount of PbO and $Bi_2O_3$. When the sintering was carried out in nitrogen atmosphere, no diffusion of Ag into the ceramic was found even in the presence of PbO and $Bi_2O_3$.

Experiment 4: Blackening of Dielectric Material Due to Ag Diffusion

In view of the above results, the following experiment was further conducted. A powder mixture of $CaZrO_3$ and 5 weight % or 10 weight %, based on $CaZrO_3$, of $Bi_2O_3$ was calcined and pulverized. The pulverized powder was mixed with a binder, a plasticizer, ethanol and butanol to prepare a slurry, which was then made into the form of green sheet by using a doctor blade. Internal electrode was printed on the surface of each green sheet using the Ag paste. The printed green sheets were then dried, stacked, press-bonded and cut out to prepare green chips. The green chips were sintered in air or nitrogen atmosphere at 900° C. for 2 hours to obtain sintered bodies.

Figure 18:
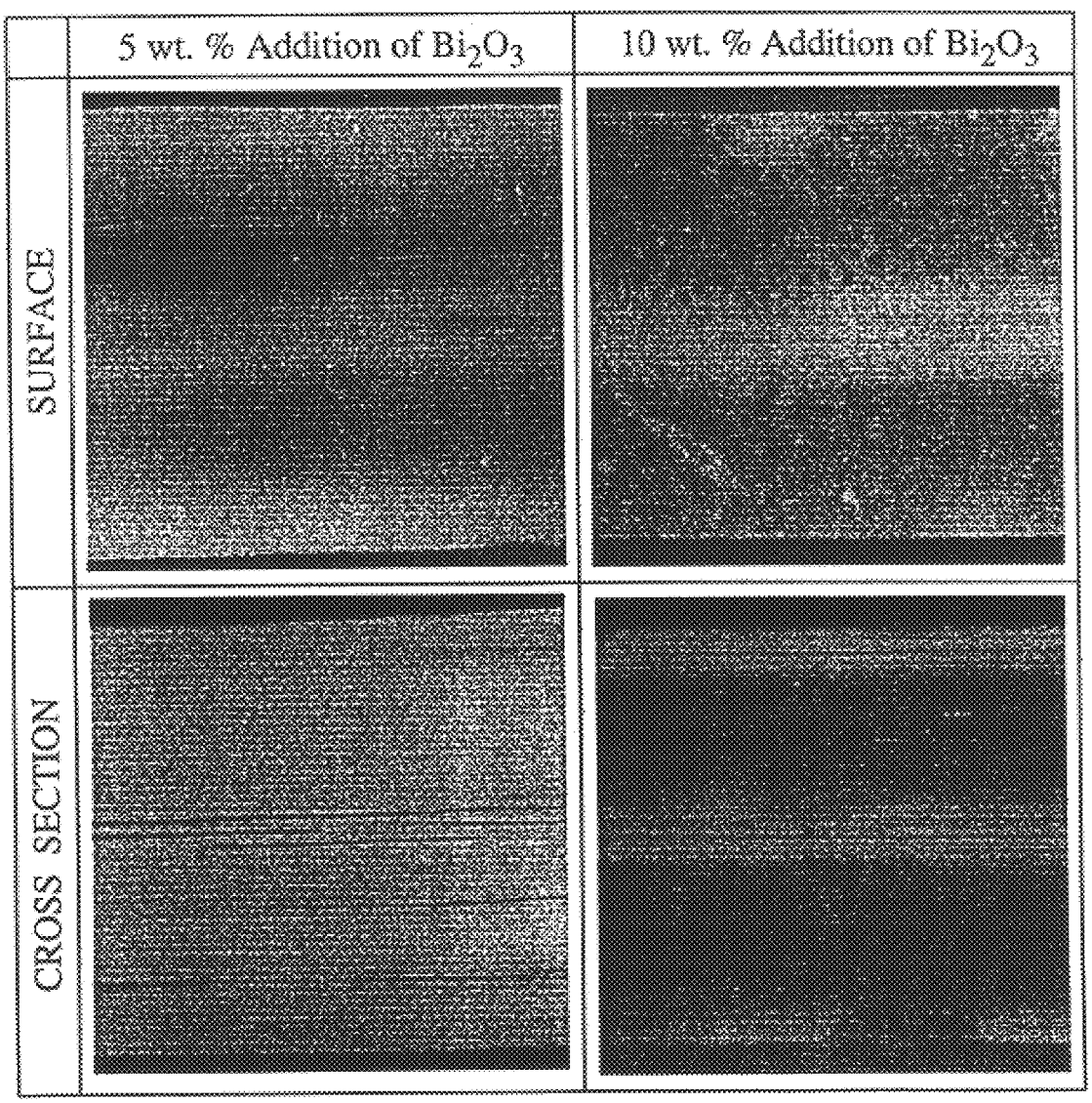
FIG. 18 shows photomicrographs of a surface and a cross section of a laminate body sintered in air.

The upper surface and the cross section of the body sintered in air was microscopically examined. The results are shown in FIG. 18. The blackening was more significant in the body added with 10 weight % of $Bi_2O_3$, this result being in agreement with the result of Experiment 3. In the body added with 5 weight % of $Bi_2O_3$, the delamination occurred due to unsuitable sheet forming conditions.

Figure 19:
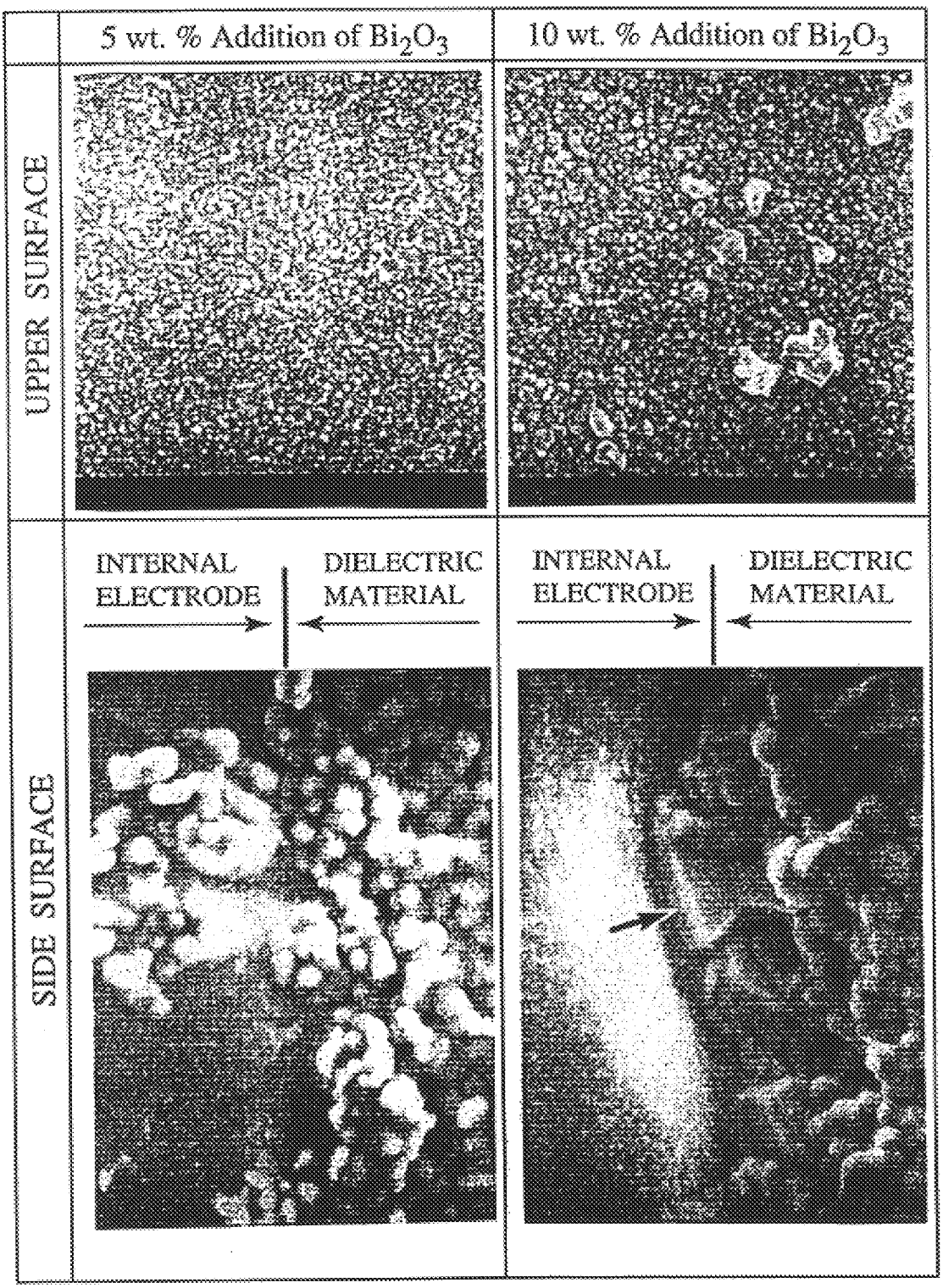
FIG. 19 shows photomicrographs by a scanning electron microscope (SEM) of a surface and a side surface of a laminate body sintered in nitrogen atmosphere.

Further, the upper surface and side surface of the body sintered in air were examined by a scanning electron microscope-energy dispersive spectroscopic X-ray (SEM-EDX). The results are shown in FIG. 19. On the surface of the sintered body added with 10 weight % of $Bi_2O_3$, a large number of white grains were observed, which were found by EDX analysis to be $Bi_2O_3$ which oozed out during the sintering process. At the boundary between the internal conductor (Ag paste) and the dielectric material in the sintered body added with 10 weight % of $Bi_2O_3$, the oozed $Bi_2O_3$ (indicated by arrow) during the sintering process was observed in addition to the $CaZrO_3$ grains.

From the foregoing, it was presumed that the color change (blackening) of the dielectric ceramic body became more significant with increasing amount of the sintering aid (component constituting the grain boundary phase) which directly contacted with Ag in the internal electrodes. The inventors expected that the study of the reactivity of Ag with the sintering aid would elucidate the Ag diffusion mechanism. Therefore, the following Experiment 5 was further conducted.

Experiment 5: Thermal Behavior of $Bi_2O_3$ and Ag During Heating

A powder mixture consisting of 95 weight % of $Bi_2O_3$ and 5 weight % of Ag was subjected to TG-DTA analysis while heating in air or in nitrogen atmosphere. Also, a powder consisting of only Ag powder was subjected to the same analysis. The melting process of the powder mixture at heating was observed under a metallographical microscope equipped with a heater for microscopic use.

Figure 20:
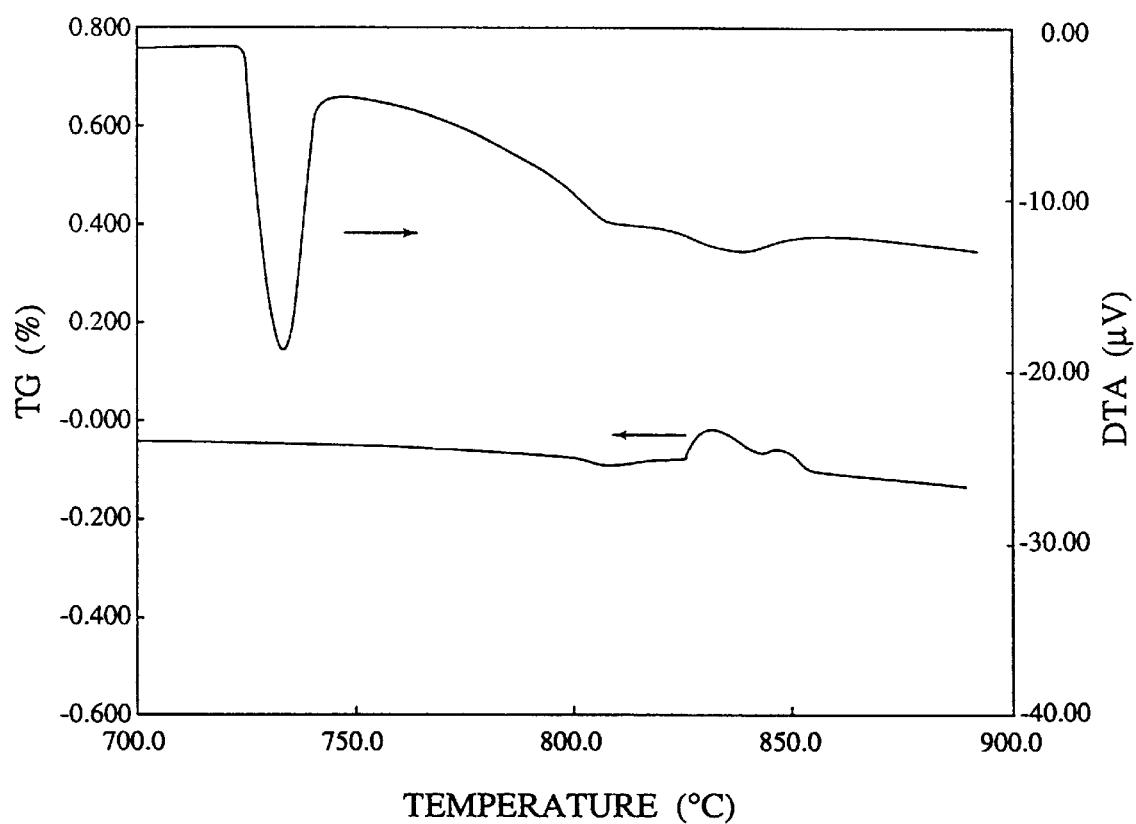
FIG. 20 is a graph showing the results of TG-DTA analysis on $Bi_2O_3$ in air.

Generally, $Bi_2O_3$ transforms from α phase to δ phase at 731° C., and melts at 827° C. FIG. 20 is a TG-DTA curve of $Bi_2O_3$ in air. From FIG. 20, it can be seen that $Bi_2O_3$ heated in air shows the same thermal change as above.

Figure 21A:
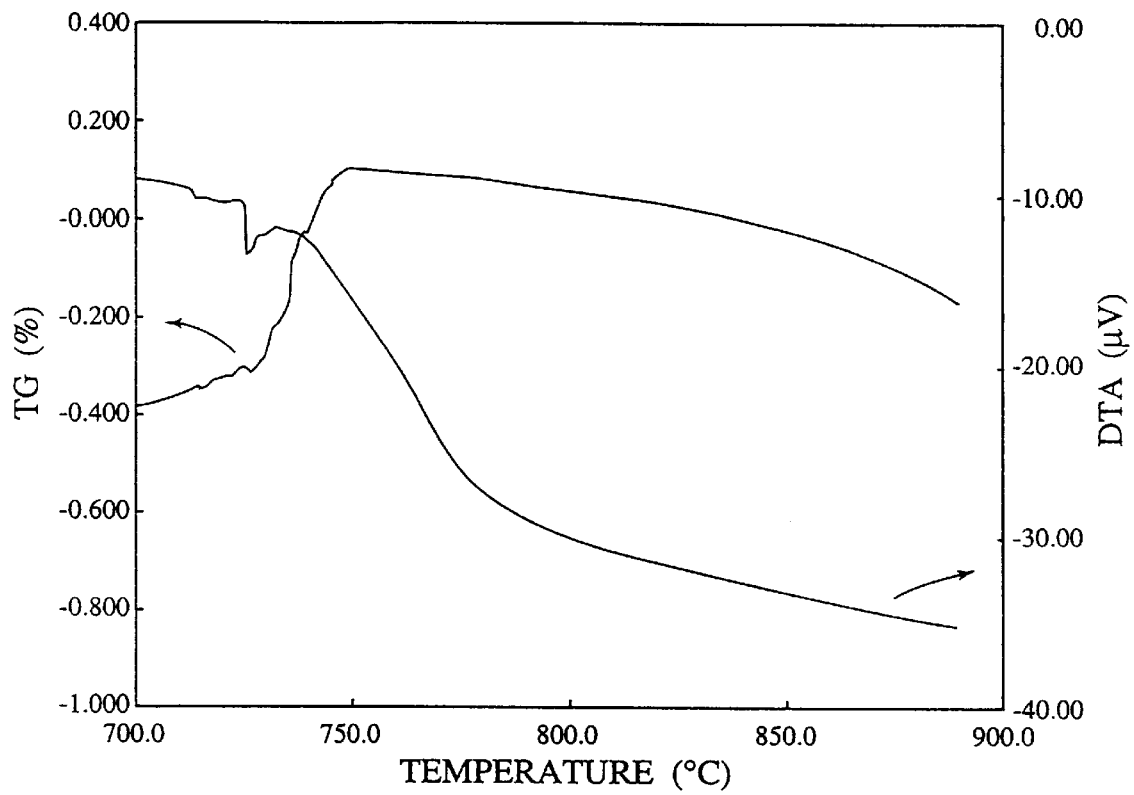
FIG. 21($a$) is a graph showing the results of TG-DTA analysis in air on the powder mixture consisting of 95 weight % of $Bi_2O_3$ and 5 weight % of Ag.
Figure 21B:
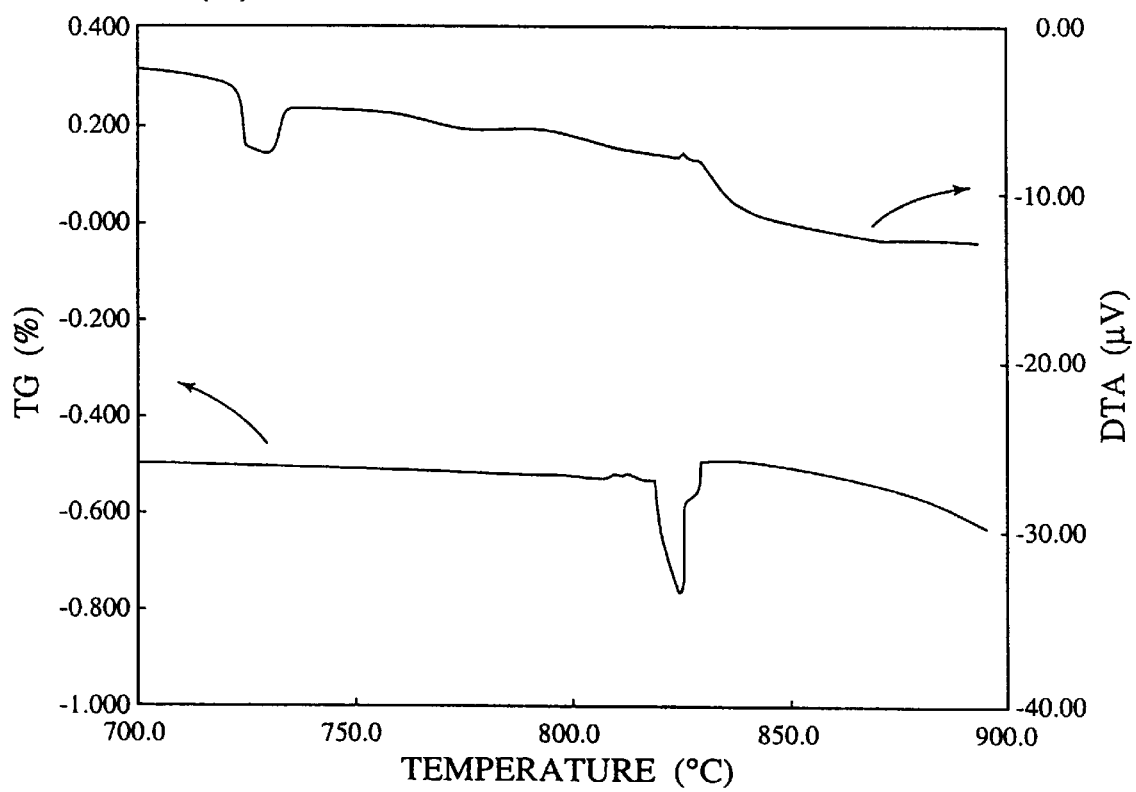

The results of TG-DTA analysis on the powder mixture are shown in FIG. 21(a) when heated in air and FIG. 21(b) when heated in nitrogen atmosphere. As seen from FIG. 21(a), in the presence of Ag, a liquid phase appeared at 726° C. and no change occurred at 827° C. when heated in air. On the other hand, as seen from FIG. 21(b), when heated in nitrogen atmosphere, the transformation occurred at 723° C. and the melting began at 819° C. The results show that, when heated in nitrogen atmosphere, the thermal behavior of $Bi_2O_3$ was not influenced by the presence of Ag. The same results as in FIG. 21(b) were obtained when the atmosphere was changed from nitrogen to argon. The same difference in the results of TG-DTA analysis between the heating in oxidative atmosphere such as air and the heating in non-oxidative atmosphere such as nitrogen and argon was observed also in a powder mixture of PbO and Ag, CuO and Ag, and $V_2O_5$ and Ag.

Further, when heated in air, it was found that the powder mixture of 95 weight % of $Bi_2O_3$ and 5 weight % of Ag melted completely at 795° C. which was far lower than the melting point (827° C.) of $Bi_2O_3$. Since the thermocouple of the heater for microscopic observation was attached to the back side of the sample vessel, the actual melting-initiation temperature and the actual melting-completion temperature were presumed to be lower than the measured temperatures. Therefore, the powder mixture completely melted at a temperature actually lower than the measured temperature of 795° C. The significant lowering of the melting-completion temperature suggests the occurrence of the reaction between Ag and oxygen during heating in air. Further, in considering the thermal decomposition temperature of oxides of Ag, it can be presumed that the oxygen adsorbed on Ag surface due to excess surface free energy reacts with Ag to form oxides such as AgO and $Ag_2O$. On the other hand, when heated in nitrogen atmosphere, the oxygen was desorbed to avoid the formation of the oxides. Thus, it has been confirmed that Ag, particularly the surface of Ag is oxidized during the heat treatment in air, and the oxides of Ag and $Bi_2O_3$ form an eutectic mixture to lower the liquid phase-forming temperature, and as a result thereof, Ag diffuses in the form of oxides into the dielectric material.

Experiment 6: Change in Color of Dielectric Material and Existing State of Ag After Additional Heat Treatment Generally, the sintered body is further subjected to baking treatment (heat treatment) for forming the external electrodes to provide a final multilayered electronic part such as BPF. The external electrodes are usually formed by Ag, and the Ag paste containing glass frit. During the baking of the external electrodes, the diffusion of Ag is presumed to occur when the baking is conducted in air.

Figure 22:
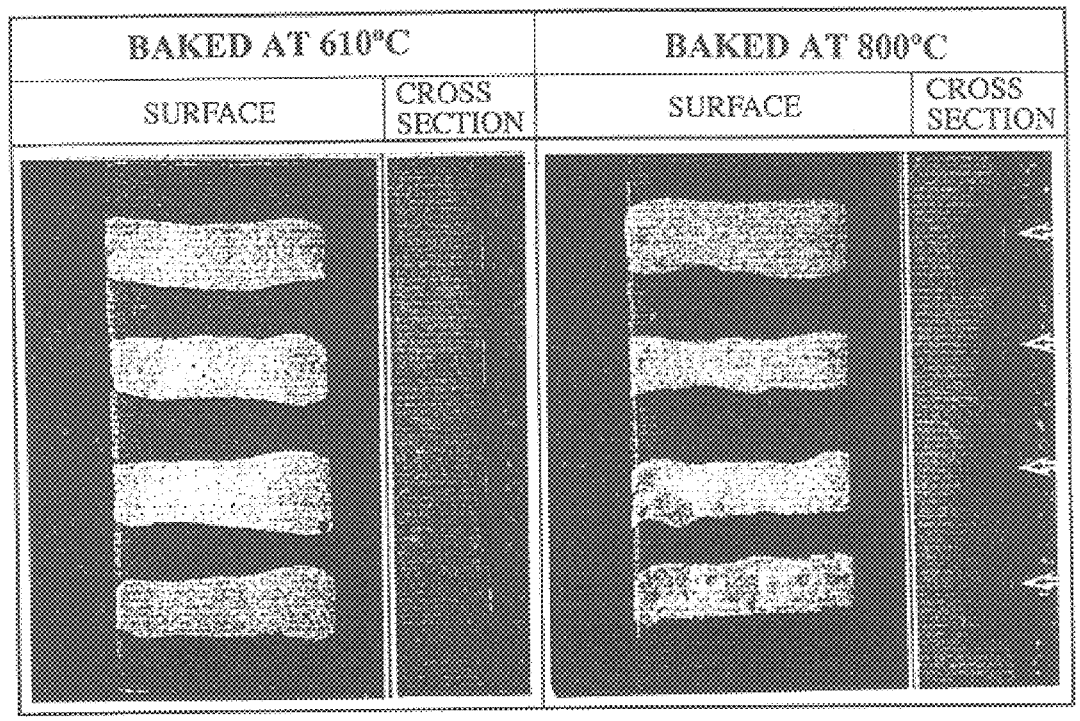
FIG. 22 shows photomicrographs of the sintered bodies baked with the external electrode in air at different temperatures.

The sintered bodies as prepared in Experiment 4 were provided with the external electrodes on the upper surface by applying the Ag paste containing glass frit and baking at 610° C. or 800° C. in air. The resultant bodies were observed cross-sectionally on the color of the dielectric ceramic body. The results are shown in FIG. 22. As seen from cross sectional views of FIG. 22, no change was found in the ceramic body when baked at 610° C., whereas when baked at 800° C., the dielectric material near the external electrodes changed to black to show the occurrence of the diffusion of Ag in the external 25 electrodes into the dielectric material. This result agrees with the result in FIG. 21(a), namely, an eutectic reaction at 726° C. causes the formation of liquid phase to promote the diffusion of Ag. Therefore, the baking in air should be conducted a temperature lower than the eutectic reaction temperature. The eutectic reaction temperature varies depending on various factors such as the kind and amount of the component constituting the grain boundary phase, the amount of Ag, the partial pressure of oxygen during the heat treatment, etc., and therefore, the baking temperature in air is determined preferably by repeating experimental measurements.

Figure 7:
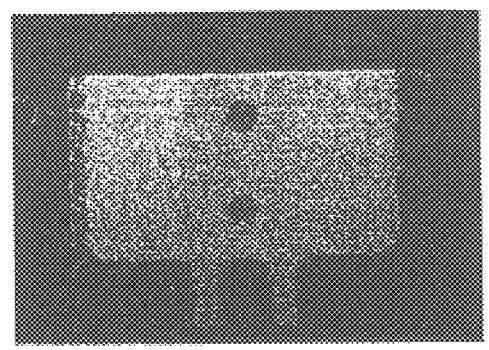
FIG. 7 is a photomicrograph showing the bottom surface of Comparative Sample No. 4 of Example 1.
Figure 8:
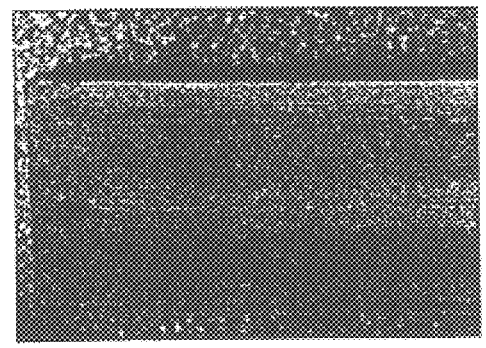
FIG. 8 is a photomicrograph showing a cross section of Comparative Sample No. 4 of Example 1.
Figure 23:
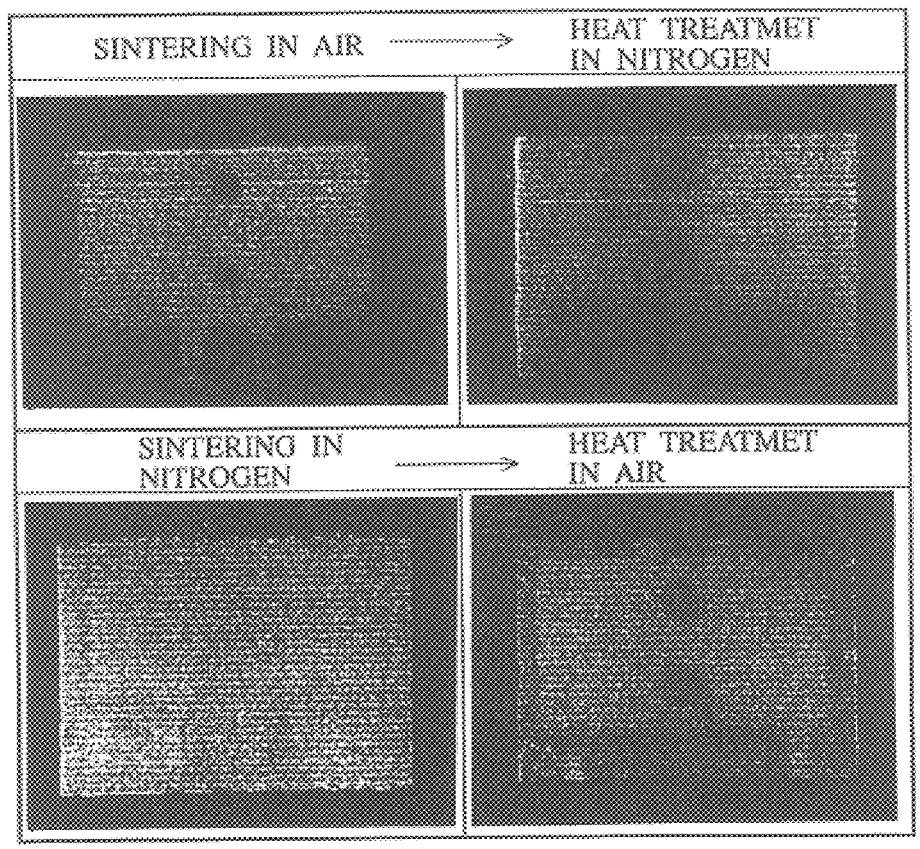
FIG. 23 shows photomicrographs of sintered bodies after additional heat treatment.

The sintered bodies as shown in FIG. 7 (sintered in air) was heat-treated at 900° C. for 2 hours in nitrogen atmosphere. Also, the sintered bodies as shown in FIG. 4 (sintered in nitrogen atmosphere) was heat-treated at 900° C. for 2 hours in air. Photomicrographs of the sintered bodies thus heat-treated are shown in FIG. 23. As seen from FIG. 23, the blackened portion formed during the sintering in air disappeared after the heat treatment in nitrogen atmosphere. Although the surface is appeared to still remain slightly blackened, the observation of the cross section showed that the blackened portion disappeared nearly completely. In the body sintered in nitrogen atmosphere and having no blackened portion, the blackened portion appeared after the heat treatment in air.

Figure 24:
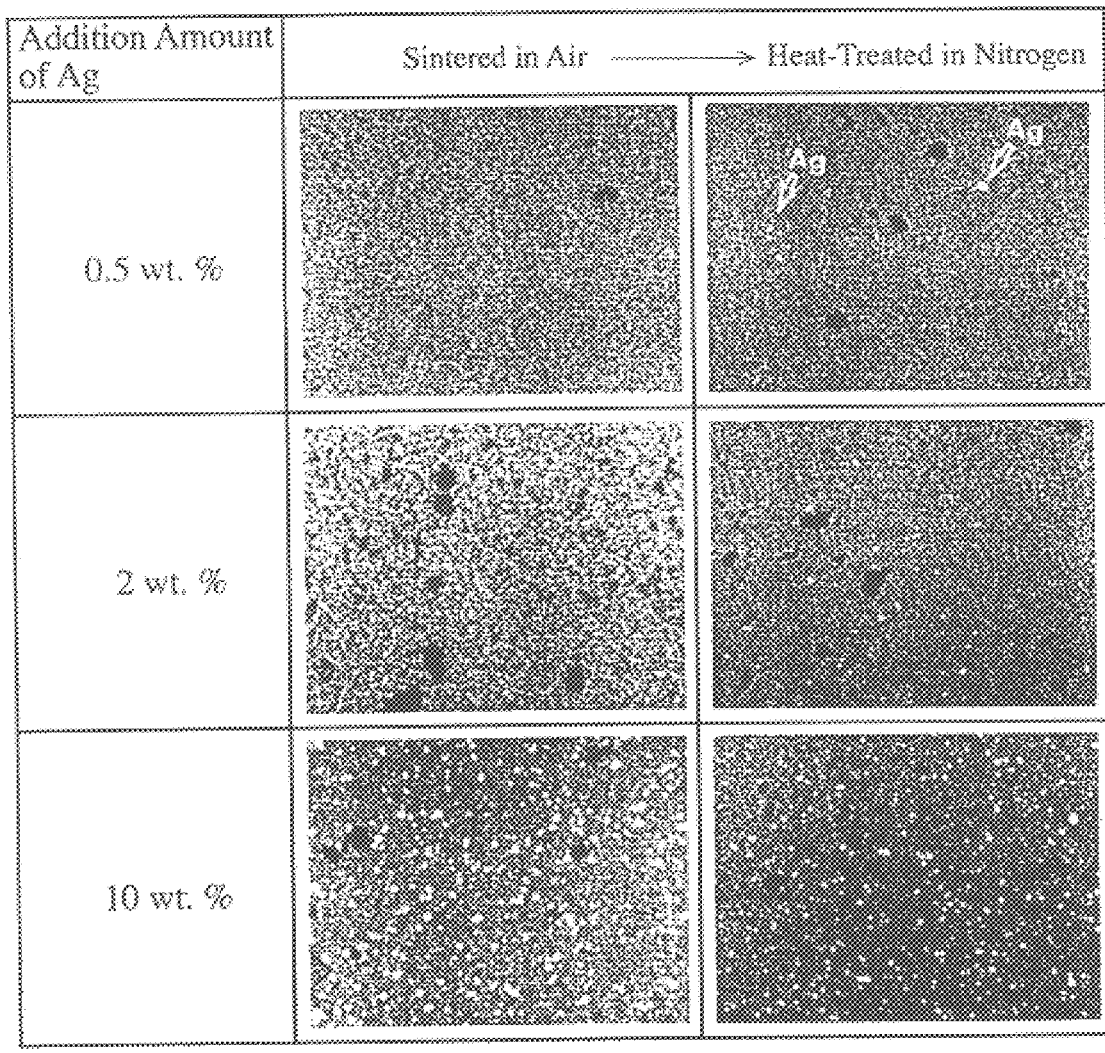
FIG. 24 shows photomicrographs of each polished surface of laminates after heat-treated in nitrogen atmosphere.

The bodies sintered in air as prepared in Experiment 1 were further heat-treated at 900° C. for 2 hours in nitrogen atmosphere. The surface of the body thus treated was observed by a metallographical microscope. Photomicrographs (magnification:×200) of the surface are shown in FIG. 24. In the bodies added with 0.5 weight % or 2 weight % of Ag, Ag in the form of metal, which was not present after the sintering in air, appeared after the heat treatment in nitrogen atmosphere.

Figure 25:
FIG. 25 is an expression showing the reversible reaction of Ag responsible for the color change of the dielectric material.

From the foregoing experiments, it has been confirmed that the diffusion of Ag occurs not only in the sintering process, but also in any stage of the production when the body is in a condition for forming the oxides of Ag, for example, a temperature of 720° C. or higher in an oxidative atmosphere, and a component capable of forming an eutectic mixture with the oxide of Ag is present in the ceramic. It has been further confirmed that the diffused Ag in the dielectric material makes the dielectric material black when heat-treated in air, and the blackening was responsible for a reversible redox reaction of Ag, which is shown in FIG. 25.

EXAMPLE 3

The procedures of producing Sample Nos. 1–4 in Example 1 were repeated while changing the conductive material, the material for constituting the main phase and the material for constituting the grain boundary phase as described below to prepare multilayered electronic parts corresponding to Sample Nos. 1–4.

(a) The Ag paste used in Example 1 was changed to a commercially available Ag-Pd paste. Although the lightness of the ceramic body was slightly different, nearly the same results as in Sample Nos. 1–4 were obtained.

(b) The Ag paste used in Example 1 was changed to a commercially available Ag-Pt paste. Although the lightness of the ceramic body was slightly different, nearly the same results as in Sample Nos. 1–4 were obtained.

(c) The internal electrodes was formed by silver foil. Nearly the same results as in Sample Nos. 1–4 were obtained.

The above results show that Ag in the electrode pattern on the green sheet unfavorably decreases the lightness of the ceramic body when both the sintering and heat treatment are made in air (corresponding to Sample No. 4), but the lightness is N8.5 or more or V8.5 or more in terms of Munsell notation when at least one of the sintering and the heat treatment is made in the non-oxidative atmosphere (corresponding to Sample Nos. 1–3).

(d) $Bi_2O_3$ used in Example 1 was changed to PbO. Nearly the same results as in Sample Nos. 1–4 were obtained. Also, it was confirmed by EDX analysis that PbO constituted the grain boundary phase.

(e) $Bi_2O_3$ used in Example 1 was changed to CuO. Nearly the same results as in Sample Nos. 1–4 were obtained. Also, it was confirmed by EDX analysis that CuO constituted the grain boundary phase.

(f) $Bi_2O_3$ used in Example 1 was changed to $V_2O_5$. Nearly the same results as in Sample Nos. 1–4 were obtained. Also, it was confirmed by EDX analysis that $V_2O_5$ constituted the grain boundary phase.

(g) $Bi_2O_3$ used in Example 1 was changed to $PbO.2Bi_2O_3.V_2O_5$. Nearly the same results as in Sample Nos. 1–4 were obtained. Also, it was confirmed by EDX analysis that $PbO.2Bi_2O_3.V_2O_5$ constituted the grain boundary phase.

(h) $Bi_2O_3$ used in Example 1 was changed to $Bi_2CuO_4$ or $PbCu_2O_2$. Nearly the same results as in Sample Nos. 1–4 were obtained. Also, it was confirmed by EDX analysis that $Bi_2CuO_4$ and $PbCu_2O_2$ constituted the grain boundary phase.

(i) $CaZrO_3$ used in Example 1 was changed to one of $BaZrO_3$, $SrZrO_3$, $PbZrO_3$, $BaTiO_3$, $BaO—TiO_2—NdO_{2/3}$, $Al_2O_3$, $CaTiO_3$, $PbTiO_3—PbZrO_3$ and $ZrO_2—TiO_2—SnO_2$. Although the lightness of the ceramic body was slightly different, nearly the same results as in Sample Nos. 1–4 were obtained in each case.

(j) $CaZrO_3$ used in Example 1 was changed to $PbTiO_3$, and one of PbO, $Bi_2O_3$, CuO and $V_2O_5$ was used as the material for constituting the grain boundary phase. Although the lightness of the ceramic body was slightly different, nearly the same results as in Sample Nos. 1–4 were obtained in each case.

(k) $CaZrO_3$ used in Example 1 was changed to each soft ferrite selected from NiCuZn ferrite, CuZn ferrite, NiZn ferrite, NiCu ferrite, Cu ferrite and Ni ferrite. In each case corresponding to Sample Nos. 1–3, a blackish surface with no undesirable point and reaction trace was obtained. The dielectric loss at 1 GHz was $5 \times 10^{-4}$ to $7 \times 10^{-4}$ in each case. Further, the procedures were repeated by replacing a part of NiO and CuO of the ferrites with $CoO_{4/3}$ in an amount corresponding to 1 mol %. Although the dielectric loss at 1 GHz was lowered by about 30%, the same results were obtained in other properties.

EXAMPLE 4

Figure 26:
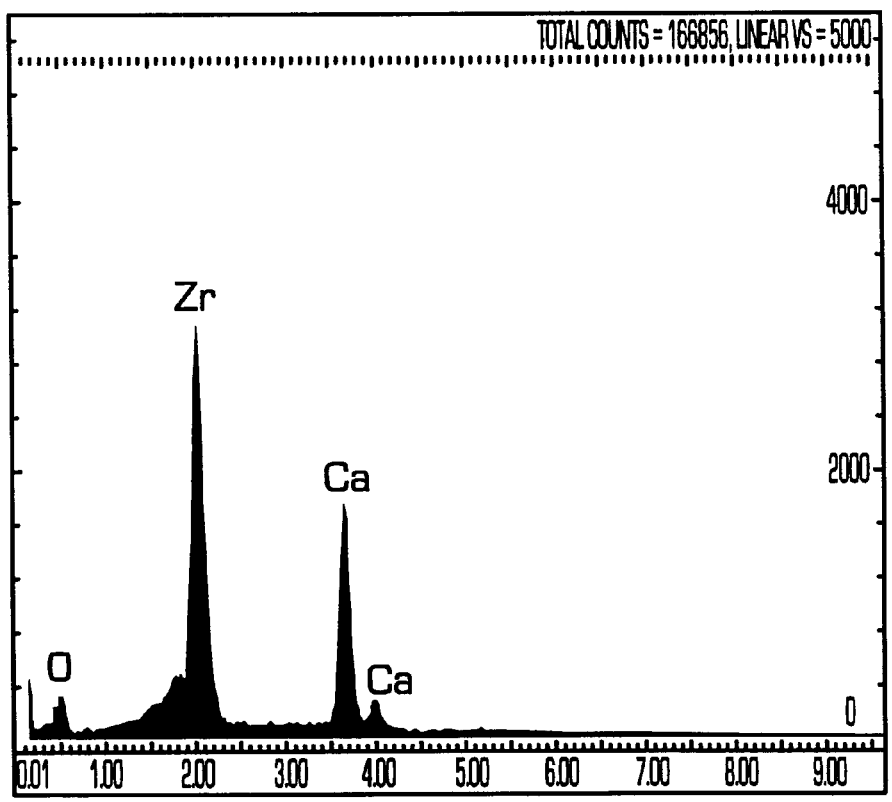
FIG. 26 is a chart showing the results of an energy dispersive spectroscopy X-ray (EDX) analysis on the main phase of Sample No. 1.
Figure 27:
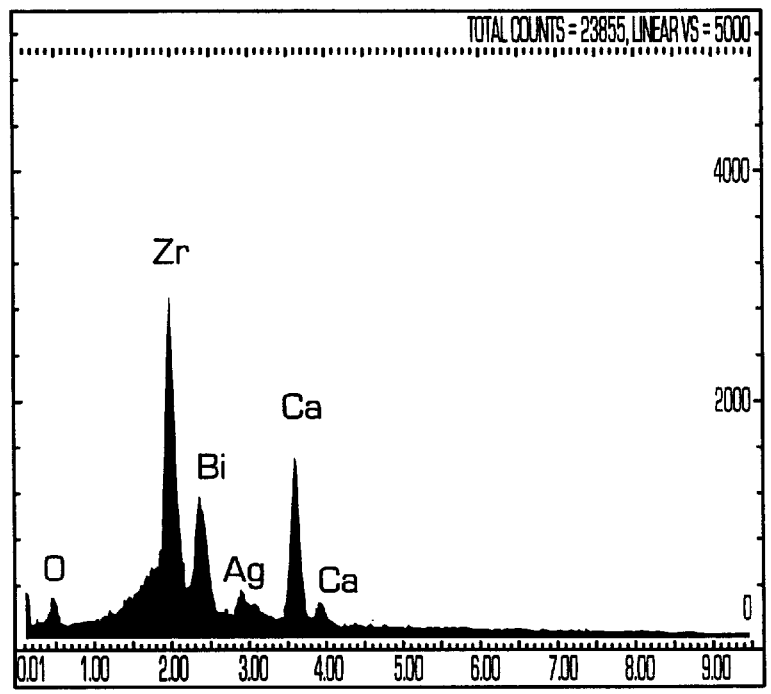
FIG. 27 is a chart showing the results of EDX analysis on the grain boundary phase of Sample No. 4.
Figure 28:
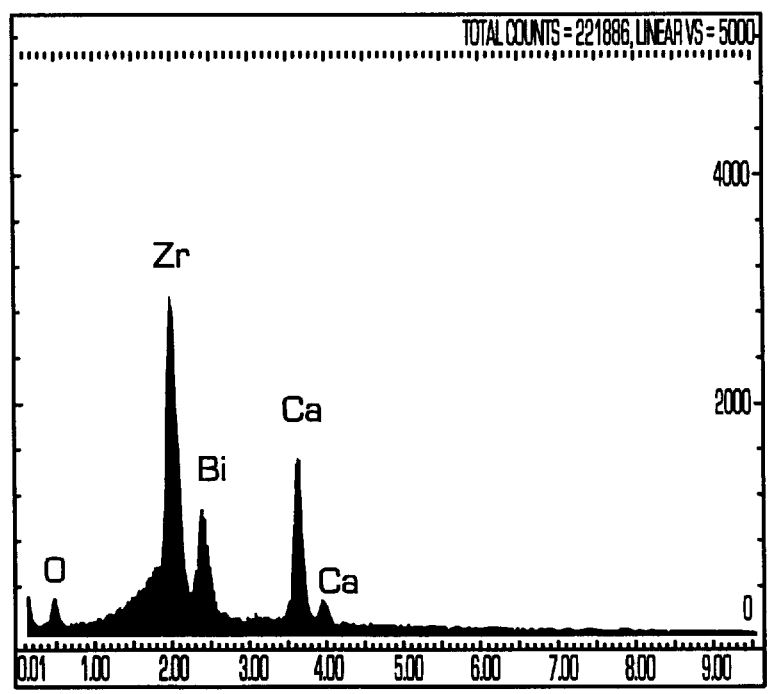
FIG. 28 is a chart showing the results of EDX analysis on the grain boundary phase of Sample No. 1.

Sample Nos. 1–4 of Example 1 were subjected to EDX analysis to examine the constituents of the grain boundary phase and the main phase. A part of the results is shown in FIGS. 26–28. FIG. 26 shows results on the main phase of Sample No. 1, FIG. 27 on the grain boundary phase of Sample No. 4, and FIG. 28 on the grain boundary phase of Sample No. 1. The analysis was made on the grains and the grain boundary triple points as shown in FIG. 2. In FIGS. 26–28, the ordinate indicates the intensity of X-ray (counts/sec), and the abscissa is the energy of the characteristic X-ray (keV).

No Ag was detected in the main phase of Sample Nos. 1–4, and in the grain boundary phase of Sample No. 1. The quantitative analysis showed that the grain boundary phase consisted of 95.0 weight % of Bi and 5.0 weight % of Ag in Sample No. 2, 98.9 weight % of Bi and 1.1 weight % of Ag in Sample No. 3, and 92.7 weight % of Bi and 7.3 weight % of Ag in Sample No. 4. The peaks of Ca and Zr in FIGS. 27 and 28 may seemingly show the presence of large amounts of Zr and Ca in the grain boundary phase. However, these peaks are spectra attributable to Zr and Ca in the main phase detected through the grain boundary phase.

In the same manner as in Example 1, various multilayered electronic parts having different Ag diffusion amounts were produced to examine the influence of the Ag content in the main phase, grain boundary phase and ceramic body as well as the sintering and/or heat treatment atmosphere on the lightness of the ceramic body and the electrical characteristics. The results showed that when the grain boundary phase contained Ag in an amount exceeding 6 weight % based on the total amount of the metals therein, the resultant multilayered electronic part had a low lightness (low Munsell value) and poor electrical characteristics even when the sintering and the heat treatment were carried out in nitrogen atmosphere. On the other hand, when the Ag content in the grain boundary phase was 5 weight % or less, at least the vicinity of the surface of the multilayered electronic part had a lightness of equal to or higher than N8.5 or V8.5 and good electrical characteristics if the sintering and/or the heat treatment is conducted in a non-oxidative atmosphere such as nitrogen. If the Ag content in the grain boundary phase was 1 weight % or less, a sufficiently preferred result was obtained even when the conditions of the sintering and/or heat treatment in the non-oxidative atmosphere were not strictly controlled.

When the oxygen content in the sintering atmosphere and/or the heat treatment (baking) atmosphere was regulated to 15 volume % for 5 minutes or longer, the intended effect of the invention was obtained. When regulated to 10 volume % for 10 minutes or longer, more preferred results were obtained. Sintering and/or baking in an non-oxidative atmosphere containing oxygen in an amount of 7 volume % or less for 20 minutes or longer was particularly preferable because the blackening of the ceramic body was not at all observed and excellent electrical characteristics were obtained.

When the Ag content in the main phase was 0.2 weight % or less based on the total amount of the metal elements therein, a lightness (Munsell value) of the ceramic body sufficient for practical use was obtained. When 0.01 weight % or less, a higher lightness was obtained. Particularly, when the Ag content was 0.003 weight % or less, no influence on the blackening of the ceramic surface was noticed.

As a result of quantitative analysis by ICP-AES (inductively coupled plasma atomic emission spectroscopy), the Ag content in the ceramic body was 0.1 weight % for Sample No. 1, 0.5 weight % for Sample No. 2, 0.3 weight % for Sample No. 3 and 0.7 weight % for Sample No. 4 each based on the total amount of the metal element therein. The above Ag contents are the averaged values at the positions 10–20 $\mu$m apart from the internal electrodes measured under an analyzed area (beam diameter) of about 1 $\mu$m. The quantitative analysis was repeated at the different portions. The content obtained under a beam diameter of about 1 $\mu$m were practically the same as the content obtained by averaging the analyzed values over an area of about 1 mm diameter. More detailed study showed that the dielectric loss was remarkably reduced and the ceramic body had a very pale yellow (5Y 8.5/2) surface with no blackened portion when the Ag content in the ceramic 10 $\mu$m or more apart from the periphery of the internal electrodes was 0.5 weight % or less based on the total amount of the metal elements present in the same portion.

EXAMPLE 5

Figure 29:
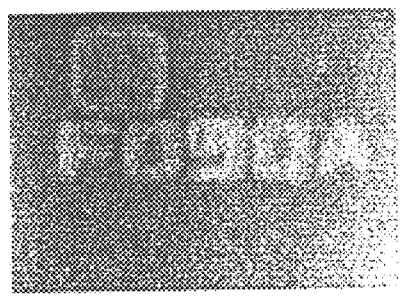
FIG. 29 is a photomicrograph showing the markers of the invention.

FIG. 29 shows photomicrographic observation of the upper surface of Sample No. 1 of Example 1, the bottom surface of which is shown in FIG. 4. The alphabetical and numerical markers in FIG. 29 indicate the kind and specification of the multilayered electronic part, and the square marker on the upper left hand indicates the position of the external output terminal. FIG. 29 shows that the ceramic body is semitransparent and free from the blackening, and therefore, excellent in visually identifying or distinguishing the markers. Since the markers are covered with the ceramic, the markers are highly resistant to the surrounding environment. For example, the markers are difficult to be corroded by acids. Therefore, the markers are not corroded or plated in error during the plating treatment such as Ni plating and solder plating at the final stage of production. In addition, the ceramic between the markers and the ceramic body surface prevents the makers from false alteration to ensure the reliability thereof. The markers may be trade marks and sketch of circuits. Further, the markers may serve also as the element of circuit. For example, the above square marker may function as a capacitor component when electrically connected to a terminal. Similarly, a part of circuit elements may be used as the markers.

Figure 30:
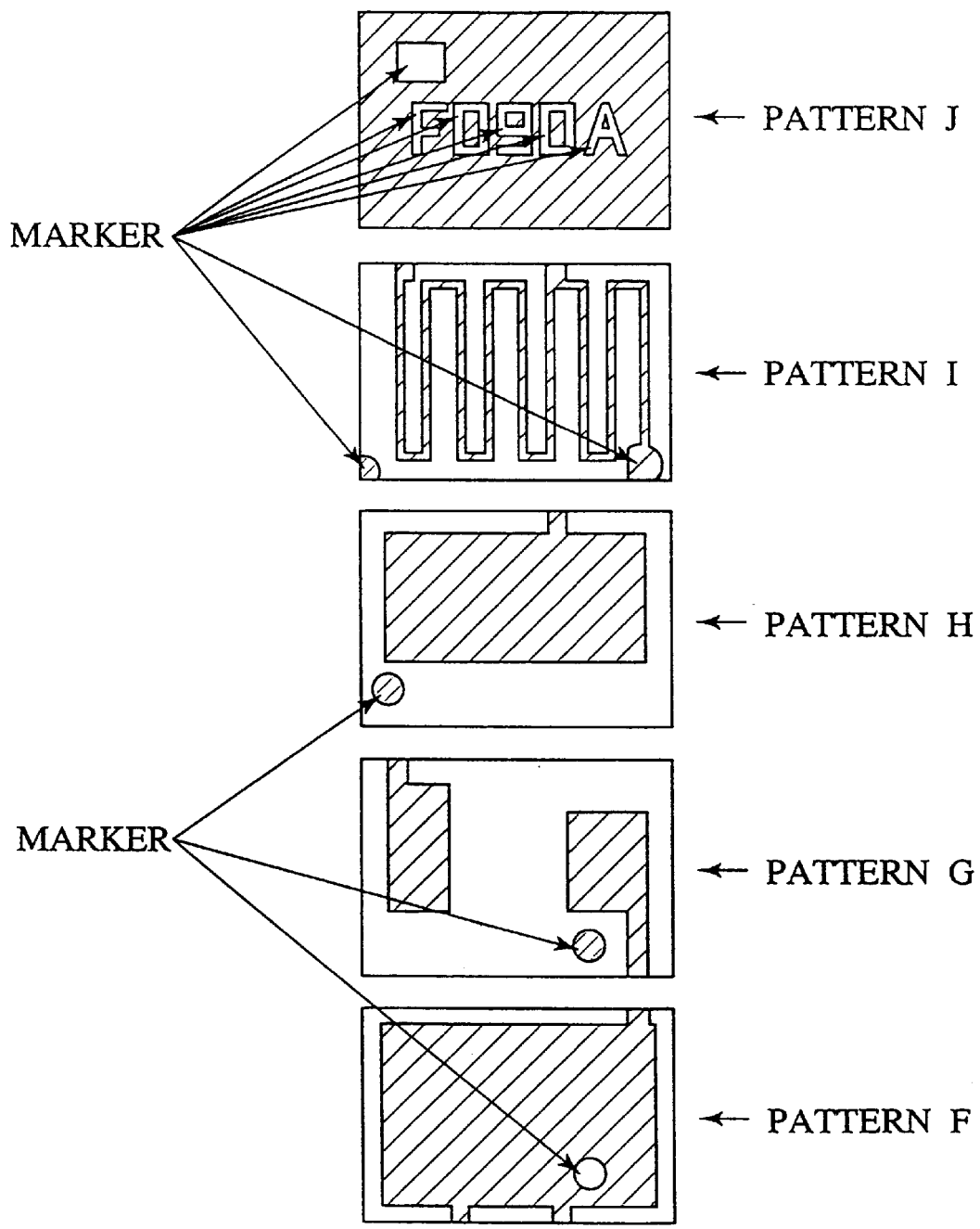
FIG. 30 is an illustration showing an example of markers of the invention.

FIG. 30 shows another embodiment of electrode patterns produced in the same manner as in Example 1. The patterns form an electronic circuit and simultaneously form markers by circular and semicircular electrode patterns and non-electrode area surrounded by the electrode pattern. The circular marker in the pattern F formed by the non-electrode area can be seen from the bottom side of the multilayered electronic part. The circular markers in the patterns G and H made of electrode pattern are utilized during the production steps. In the pattern I, two semicircular markers are made in the lower left side and the lower right side which serve also as output terminals. The pattern J is in the positive and negative relation with the pattern E of FIG. 3. The pattern J produces a large electrostatic capacity and ensures a good grounding. Since the ceramic body was semitransparent with a high lightness, the markers were easily and correctly identified or distinguished and found to be remarkably effective for correctly aligning the parts in the indicated direction during the production process, and for distinguishing the kind, specification and position of output terminals of the final product. Separately, the same markers as in FIG. 29 were formed on the top surface of the dielectric ceramic body. Although the marker did not show a resistance to the environment, the makers were excellent in visual identification and distinguishability due to a high lightness with no blackened portion of the ceramic body.

As described above in detail, according to the invention, the diffusion of Ag into the grain boundary in the ceramic body is prevented to provide a ceramic having a good appearance (a high lightness with a minimum blackened portion) and excellent electrical characteristics such as dielectric loss, this enabling to produce multilayered electronic parts of high performance. In addition, multilayered electronic parts having markers which are highly reliable and excellent in visual identification and distinguishability can be produced.

What is claimed is:

1. A multilayered electronic part with a minimized silver diffusion into a ceramic body, produced from a laminated body of a plurality of ceramic green sheets, at least one of said ceramic green sheets being printed thereon internal electrode patterns containing silver, and said ceramic body being an integral part made from said plurality of ceramic green sheets and containing a main phase and a grain boundary phase.

2. The multilayered electronic part according to claim 1, wherein an amount of silver at a portion in said ceramic body 10 $\mu$m or more apart from the periphery of said internal electrode patterns is 0.5 weight % or less based on a total amount of metal elements present in said portion in said ceramic body 10 $\mu$m or more apart from the periphery of said internal electrode patterns.

3. The multilayered electronic part according to claim 1, wherein an amount of silver in said grain boundary phase is 5 weight % or less based on a total amount of metal elements present in said grain boundary phase.

4. The multilayered electronic part according to claim 1, wherein an amount of silver in said main phase is 0.2 weight % or less based on a total amount of metal elements present in said main phase.

5. The multilayered electronic part according to claim 1, wherein said grain boundary phase contains at least one element selected from the group consisting of Pb, Bi, Cu and V.

6. The multilayered electronic part according to claim 1, having a dielectric loss of $7 \times 10^{-4}$ or less at 1 GHz.

7. The multilayered electronic part according to claim 1, wherein a material for constituting said main phase is at least one soft ferrite selected from the group consisting of NiCuZn ferrite, CuZn ferrite, NiZn ferrite, NiCu ferrite, Cu ferrite and Ni ferrite.

8. The multilayered electronic part according to claim 1, wherein said material for constituting said main phase is a dielectric material.

9. The multilayered electronic part according to claim 8, wherein said dielectric material is at least one selected from the group consisting of $CaZrO_3$, $BaZrO_3$, $SrZrO_3$, $PbZrO_3$, $BaTiO_3$, $CaTiO_3$, $PbTiO_3$, $PbTiO_3$—$PbZrO_3$, $Al_2O_3$, $BaO$—$TiO_2$—$NdO_{2/3}$ and $ZrO_2$—$TiO_2$—$SnO_2$.

10. The multilayered electronic part according to claim 8, wherein said ceramic body has a lightness of N6.5 or more or V6.5 or more in terms of Munsell color notation.

11. The multilayered electronic part according to claim 8, wherein said ceramic body has a hue of 5R through 5YR to 5Y in Munsell hue circle and a saturation of C9 or less in terms of Munsell color notation.

12. The multilayered electronic part according to claim 8, wherein said ceramic body is semitransparent or opaque.

13. The multilayered electronic part according to claim 8, wherein an electrode pattern on a surface of said ceramic body or an internal electrode pattern visible through a surface of said ceramic body constitutes a marker by said electrode pattern area or a non-electrode area surrounded by said electrode pattern.

14. The multilayered electronic part according to claim 13, wherein said marker is constituted by at least one of letters, numerical figures and symbols and indicates at least one information of a function of said external electrode, a direction of said electronic part to be aligned, a kind of said electronic part, a production number of said electronic part, a specification of said electronic part and a name of manufacturer.

* * * * *